(12) United States Patent
Korenaga

(10) Patent No.: US 6,903,468 B2
(45) Date of Patent: Jun. 7, 2005

(54) MOVING STAGE DEVICE IN EXPOSURE APPARATUS

(75) Inventor: Nobushige Korenaga, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 94 days.

(21) Appl. No.: 10/637,524

(22) Filed: Aug. 11, 2003

(65) Prior Publication Data

US 2004/0095563 A1 May 20, 2004

(30) Foreign Application Priority Data

Aug. 12, 2002 (JP) .......................................... 2002-235144

(51) Int. Cl.$^7$ .......................... H02K 7/09; H02K 41/00
(52) U.S. Cl. ........................................... 310/12; 355/53
(58) Field of Search ........................... 310/12–14, 90.5; 355/53, 72

(56) References Cited

U.S. PATENT DOCUMENTS

| | | | |
|---|---|---|---|
| 3,747,998 A | * 7/1973 | Klein et al. ................. | 310/90.5 |
| 3,791,704 A | * 2/1974 | Perper ........................ | 310/90.5 |
| 5,202,598 A | * 4/1993 | Katsumata ................. | 310/90.5 |
| 5,467,720 A | 11/1995 | Korenaga et al. ............. | 108/20 |
| 5,684,856 A | 11/1997 | Itoh et al. ...................... | 378/34 |
| 5,841,250 A | 11/1998 | Korenagea et al. ......... | 318/135 |
| 6,002,465 A | 12/1999 | Korenaga ..................... | 355/53 |
| 6,037,680 A | 3/2000 | Korenaga et al. ............. | 310/12 |
| 6,107,703 A | 8/2000 | Korenaga et al. ............. | 310/12 |
| 6,128,069 A | 10/2000 | Korenaga ..................... | 355/53 |
| 6,157,159 A | 12/2000 | Korenaga et al. ........... | 318/649 |
| 6,172,738 B1 | 1/2001 | Korenaga et al. ............. | 355/53 |
| 6,177,978 B1 | 1/2001 | Korenaga ..................... | 355/53 |
| 6,265,793 B1 | 7/2001 | Korenaga ..................... | 310/12 |
| 6,320,645 B1 | 11/2001 | Inoue et al. ................... | 355/53 |
| 6,359,677 B2 | 3/2002 | Itoh et al. ...................... | 355/53 |
| 6,414,742 B1 | 7/2002 | Korenaga et al. ............. | 355/53 |
| 6,479,991 B1 | 11/2002 | Korenaga ..................... | 324/226 |
| 6,570,645 B2 | 5/2003 | Korenaga et al. ............. | 355/75 |
| 2001/0031191 A1 | 10/2001 | Korenaga ..................... | 414/200 |
| 2003/0007140 A1 | 1/2003 | Korenaga ..................... | 355/72 |
| 2003/0102723 A1 | 6/2003 | Korenaga ..................... | 310/12 |

* cited by examiner

Primary Examiner—Darren Schuberg
Assistant Examiner—Judson H. Jones
(74) Attorney, Agent, or Firm—Fitzpatrick, Cella, Harper & Scinto

(57) ABSTRACT

Disclosed is a stage device by which high precision motion and high speed motion can be accomplished simultaneously. The stage device includes a stage, a repulsive magnet unit for accelerating and/or decelerating the stage with respect to a movement direction, and a magnetic driving system for controlling the position of the stage. The repulsive force generator has (i) a repulsive stator, as a set magnet, including a plurality of magnets disposed along a direction orthogonal or substantially orthogonal to the movement direction, with a spacing therebetween while different poles of them are opposed to each other, and (ii) a repulsive movable element, as an insert magnet, to be mountably and demountably inserted into the spacing and being disposed in relation to the repulsive stator so that the same poles are opposed to each other.

17 Claims, 18 Drawing Sheets

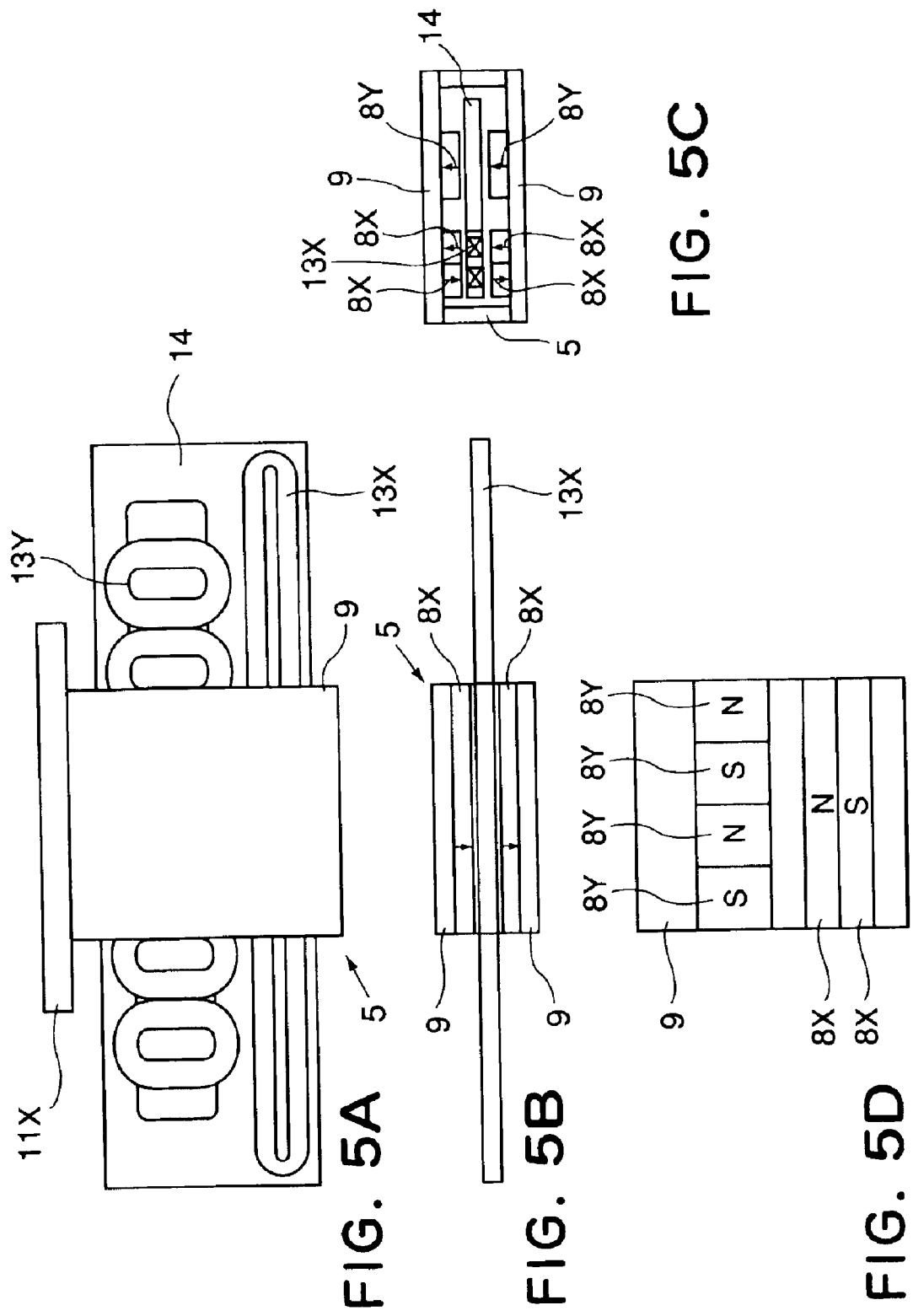

MOVING STAGE DEVICE IN EXPOSURE APPARATUS

FIELD OF THE INVENTION AND RELATED ART

This invention relates to a moving stage device, a method of moving a moving stage and an exposure apparatus. More particularly, the invention concerns a moving stage device to be controlled very precisely.

FIG. 10 is a general and perspective view of a conventional moving stage device, and FIG. 11 is a block diagram of a control system of the same. FIGS. 12A–12D are schematic views, respectively, including three drawings of a peripheral portion of a linear motor.

In FIG. 10, a base guide 1 is fixed to an unshown base, and the base guide 1 supports a stage 3 for carrying thereon a workpiece 2 for sliding movement in one axial direction relative to the base guide 1. The motion of the stage 3 in a Z tilt direction is restricted by means of an air slide which is defined between the top face of the base guide 1 and the bottom face of the stage 3. Rotation of the stage 3 about a Z axis is restricted by means of an air slide defined between a side face of a yaw guide 4 and a side face of the base guide 1. Fixedly mounted at the opposite sides of the stage 3 are linear motor movable elements 5, each being disposed opposed to a linear motor stator 6 without contact thereto. Each stator 6 is fixed to an unshown base, through legs 7 at opposite ends thereof.

FIGS. 12A–12D show details of each linear motor LM. FIG. 12A is a top plan view, FIG. 12B is a front view, and FIG. 12C is a side view. FIG. 12D is a plan view of a lower movable magnet 8 and a lower yoke 9. The linear motor movable element 5 comprises upper and lower four-pole magnets 8 and corresponding upper and lower yokes 9 for circulation of the magnetic fluxes of the movable magnets 8, which are combined into an integral structure. The movable element 5 has two such integral structures which are disposed above and below, and connected by use of side walls 10. The movable magnets 8 are magnetized in Z direction, respectively. The magnetized directions are illustrated by arrows in the drawing.

The linear motor stator 6 comprises a plurality of flat coils 13 (six in this example) which are disposed in an array and fixed to a coil holder (stator frame) 14.

The linear motor LM is a typical brushless DC motor exploded type and, in this example, it has a two-phase and four-pole structure. By switching driving coils and electric current directions in accordance with the relative positional relation between the magnets 8 and the coils 13, the linear motor LM produces a desired force in a desired direction.

The block diagram of FIG. 11 illustrates a control system for such structure. This control system comprises a position profile generator 16 and a position controller 17. This position profile generator 16 applies a position profile with which acceleration, constant speed, and deceleration are repeated to repeat and reciprocate the same process.

The position controller 17 comprises an interferometer 18 for measuring the position of the stage 3, a control operation unit 19 for calculating a control command on the basis of the difference between the position measured by the interferometer 18 and the position profile, and an electric current amplifier 20 for flowing an electric current proportional to the control command to coils 13 of the linear motor LM.

With this control system, an electric current is applied to the coils 13 of the linear motor LM so as to remove the difference between the position profile and the actual position, so as to perform high precision position control independently of acceleration, deceleration and constant-speed periods.

On the other hand, a structure in which elastic (resilient) members such as a coil spring are provided at opposite ends of the stroke so that only acceleration and deceleration are carried out by use of such elastic member. Even in such system with coil spring, the control system may be such as shown in FIG. 11. In that occasion, if the acceleration and deceleration forces operate normally with use of the elastic member such as coil spring, heat generation resulting from acceleration and deceleration can be removed substantially completely.

SUMMARY OF THE INVENTION

Linear motor drive is advantageous in the point that high precision position control is attainable stably. However, heat generation during acceleration and deceleration is large, and the source of heat generation is close to the workpiece. It is difficult to cool the whole stator of the linear motor. This causes problems of deformation of a component around the workpiece due to thermal expansion, deformation of a measurement reference due to thermal expansion, and disturbance of air density in the light path of the laser interferometer. As a result, positional precision of the workpiece would be degraded.

On the other hand, in a system in which elastic members such as a coil spring are provided at the opposite ends of the stroke so that only acceleration and deceleration are carried out with use of such elastic members, although heat generation can be removed substantially completely as long as the acceleration and deceleration forces operate normally, there are still two problems.

One problem is that heat generation can be reduced only when the period of reciprocation is very long. If the mass of an elastic member such as a spring can be disregarded, after the acceleration based on the spring is completed and the spring and the stage are disengaged from each other, the spring can be kept in a state without deformation. The stage performs constant-speed motion, and the stage engages with the spring at the opposite side and flexes it so that all the kinetic energy is converted into spring elastic energy (resilience). Then, with this energy, the stage is accelerated in an opposite direction, and then it reaches the same speed as before and keeps the displacement at the moment as the stage becomes just the maximum speed, namely, the stage without deformation.

After this, the stage engages with the spring at the initial side while keeping its maximum speed. The kinetic energy is thus converted into the elastic energy of the spring. The acceleration and deceleration can be executed by repeating the above-described procedure. Actually, however, the mass of the spring can not be disregarded. Therefore, after the acceleration is completed and the spring and the stage are disengaged from each other, the spring causes simple harmonic oscillation. Thus, the displacement of the spring when the stage engages with the spring again is inaccurate, and the force applied by the spring to the stage varies largely. Such variation must be compensated for by the linear motor and, as a result, heat generation can not be reduced.

Only when the period of reciprocation is very long, during a period after the stage and the spring are disengaged from each other and before they engage again, simple harmonic oscillation of the spring can be rectified such that heat generation in repeated reciprocation motion can be reduced.

Another problem is that, when the elastic member contacts the stage, simple harmonic oscillation of the spring itself is excited thereby. Even if the spring is in a state without displacement just before the stage engages with the spring, as they engage with each other simple, it causes harmonic oscillation of the spring itself as determined by the spring constant of the spring and the mass of the spring itself. Since the simple harmonic oscillation of the spring single unit has a sufficiently high frequency as compared with the simple harmonic oscillation based on the mass of the stage and spring, the spring and the stage can not be held in contact with each other, but rather they are repeatedly disengaged and then engaged from and with each other.

Since the acceleration and deceleration periods in the exposure apparatus are very short, such state continues until the spring and the stage are disengaged from each other after they engage with each other. Namely, external disturbance of the frequency of simple harmonic oscillation of the spring itself is mixed into the force to be applied by the spring to the stage. Thus, at the moment of the end of acceleration, there remains a positional deviation corresponding to the amount that can not be suppressed by a servo system. This leads to an increase of the control time before start of the exposure operation, and a decrease of the productivity.

It is accordingly an object of the present invention to provide a moving stage device, a method of moving a moving stage and/or an exposure apparatus, by which high precision motion and high speed motion can be accomplished simultaneously.

It is another object of the present invention to provide acceleration means by which large thrust and small or null heat generation can be accomplished simultaneously.

It is a further object of the present invention to provide repulsive acceleration means with no simple harmonic oscillation.

In accordance with an aspect of the present invention, to achieve at least one of the objects described above, there is provided a moving stage device, comprising: a movable stage; a magnetic driving system for controlling a position of the stage; and a repulsive force generator for accelerating and/or decelerating the stage with respect to a movement direction, said repulsive force generator having (i) a set magnet including a plurality of magnets disposed along a direction orthogonal or substantially orthogonal to the movement direction, with a spacing therebetween while different poles of them are opposed to each other, and (ii) an insert magnet to be mountably and demountably inserted into the spacing and being disposed with respect to the set magnet so that the same poles are opposed to each other.

In one preferred form of this aspect of the present invention, one of the set magnet and the insert magnet is provided at each of opposite ends of the stage, while the other of the set magnet and the insert magnet is provided at each of opposite ends of a stroke of the stage.

The set magnet may sandwich the insert magnet with respect to a direction orthogonal or substantially orthogonal to the first direction.

The magnetic driving system may be operable to perform positional control with respect to X, Y and θ directions, where Y is the movement direction, X is a direction orthogonal to the movement direction, and θ is a rotational direction about an axis perpendicular to an X-Y plane.

The magnetic driving system may include a single-phase linear motor, and wherein said linear motor includes a movable element being movable integrally with the stage.

The set magnet and the insert magnet may have a plate-like member being magnetized in its thickness direction.

In accordance with another aspect of the present invention, there is provided an exposure apparatus, comprising: a movable stage; a magnetic driving system for controlling a position of the stage; and a repulsive force generator for accelerating and/or decelerating the stage with respect to a movement direction, said repulsive force generator having (i) a set magnet including a plurality of magnets disposed along a direction orthogonal or substantially orthogonal to the movement direction, with a spacing therebetween while different poles of them are opposed to each other, and (ii) an insert magnet to be mountably and demountably inserted into the spacing and being disposed with respect to the set magnet so that the same poles are opposed to each other, wherein the amount of insertion of the insert magnet into the spacing is changeable in accordance with dose in exposure with respect to a substrate to be placed on the stage.

In accordance with a still further aspect of the present invention, there is provided an exposure apparatus, comprising: a movable stage; a magnetic driving system for controlling a position of the stage; and a repulsive force generator for accelerating and/or decelerating the stage with respect to a movement direction, said repulsive force generator having (i) a set magnet including a plurality of magnets disposed along a direction orthogonal or substantially orthogonal to the movement direction, with a spacing therebetween while different poles of them are opposed to each other, and (ii) an insert magnet to be mountably and demountably inserted into the spacing and being disposed with respect to the set magnet so that the same poles are opposed to each other, wherein a relative position of the set magnet and the insert magnet is changeable in accordance with an exposure region of a substrate to be placed on the stage.

In accordance with a yet further aspect of the present invention, there is provided an exposure apparatus, comprising: a movable stage for holding thereon a substrate to be exposed; a magnetic driving system for controlling a position of the stage; and a repulsive force generator for accelerating and/or decelerating the stage with respect to a movement direction, said repulsive force generator having (i) a set magnet including a plurality of magnets disposed along a direction orthogonal or substantially orthogonal to the movement direction, with a spacing therebetween while different poles of them are opposed to each other, and (ii) an insert magnet to be mountably and demountably inserted into the spacing and being disposed with respect to the set magnet so that the same poles are opposed to each other.

In accordance with a still further aspect of the present invention, there is provided a method of moving a moving stage, comprising the steps of: accelerating the stage with respect to a movement direction by use of a repulsive force generator, the repulsive force generator having (i) a set magnet including a plurality of magnets disposed along a direction orthogonal or substantially orthogonal to the movement direction, with a spacing therebetween while different poles of them are opposed to each other, and (ii) an insert magnet to be mountably and demountably inserted into the spacing and being disposed with respect to the set magnet so that the same poles are opposed to each other; and controlling the position of the stage after the acceleration, by use of a driving system.

In accordance with another aspect of the present invention, there is provided a device manufacturing method, comprising the steps of: providing a group of production machines for various processes, including an exposure apparatus as recited above, in a semiconductor manufacturing factory; and producing a semiconductor device through plural processes using the production machine group.

In one preferred form of this aspect of the present invention, the method further comprises (i) connecting the production machines of the group with each other through a local area network, and (ii) executing data-communication concerning information related to at least one production machine of the production machine group, between the local area network and an external network outside the semiconductor manufacturing factory.

A database provided by a vendor or a user of the exposure apparatus can be accessed through the external network so that maintenance information related to the production machine can be obtained through the data communication, and wherein production control can be performed on the basis of data communication made through the external network and between the semiconductor factory and a separate semiconductor factory.

In accordance with a yet further aspect of the present invention, there is provided a semiconductor manufacturing factory, comprising: a group of production machines for various processes, including an exposure apparatus as recited above; a local area network for connecting the production machines of the production machine group with each other; and a gateway for enabling an access from the local area network to an external network outside the factory; wherein information related to at least one production machine in the group can be data communicated by use of the local area network and the gateway.

In accordance with a still further aspect of the present invention, there is provided a method of executing maintenance for an exposure apparatus, provided in a semiconductor manufacturing factory, said method comprising the steps of: preparing, by a vendor or a user of an exposure apparatus as recited above, a maintenance database connected to an external network outside the semiconductor manufacturing factory; admitting an access from the semiconductor manufacturing factory to the maintenance database through the external network; and transmitting maintenance information stored in the maintenance database to the semiconductor manufacturing factory through the external network.

More preferably, the apparatus may further comprise a display, a network interface and a computer for executing network software, wherein maintenance information related to said exposure apparatus is data communicated through the computer network.

More preferably, the network software may provide on the display a user interface for accessing a maintenance database prepared by a vendor or a user of said exposure apparatus and connected to an external network outside a factory where said exposure apparatus is placed, thereby to enable obtaining information from the database through the external network.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 5A–5D illustrate the structure around a movable element with an X mirror according to the present invention, wherein FIG. 5A is a plan view, FIG. 5B is a front view, FIG. 5C is a side view, and FIG. 5D is a fragmentary and front view showing only a lower yoke and a lower magnet.

FIGS. 12A–12D show a conventional linear motor, wherein FIG. 12A is a plan view, FIG. 12B is a front view, FIG. 12C is a side view, and FIG. 12D is a fragmentary and front view showing only a lower yoke and a lower magnet.

DESCRIPTION OF THE PREFERRED EMBODIMENTS

Preferred embodiments of the present invention will now be described with reference to the attached drawings.

First Embodiment

Figure 1A:
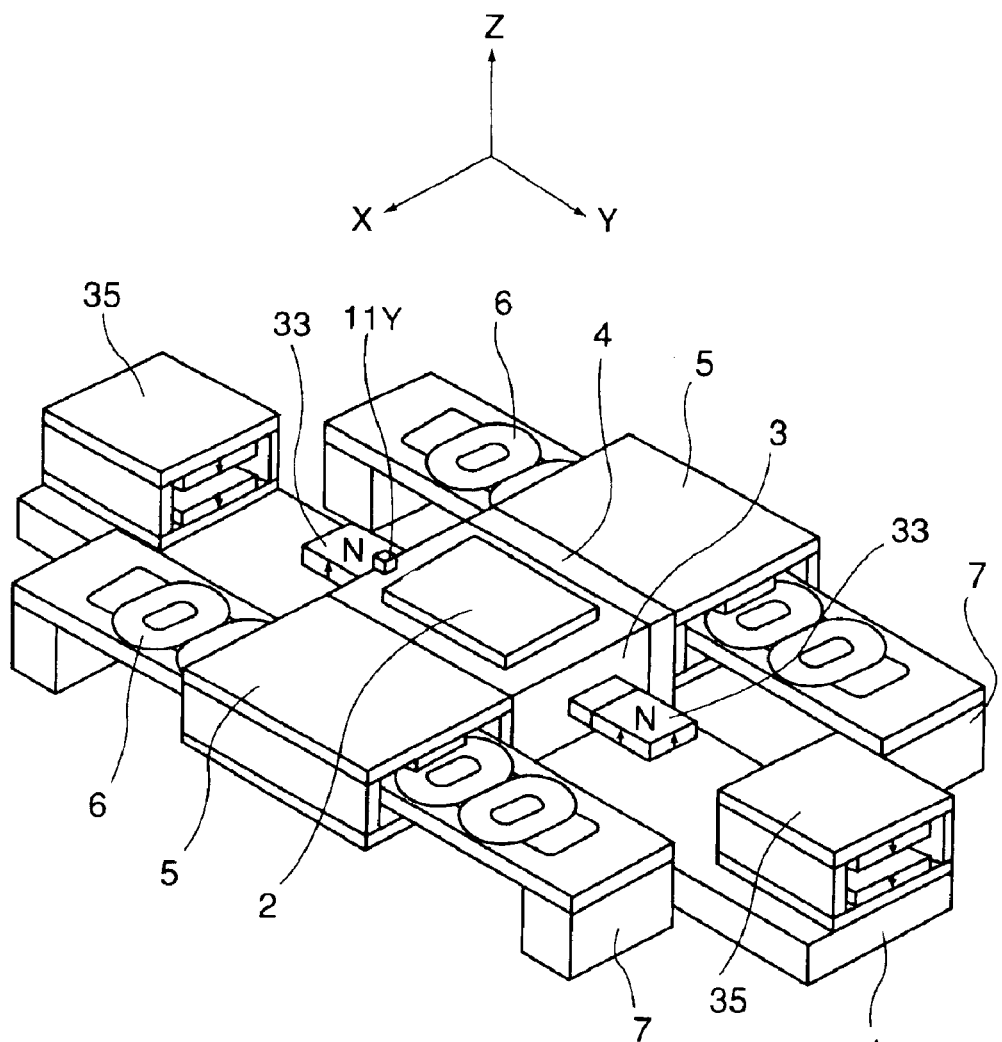
FIG. 1A is a perspective view of a moving stage device according to a first embodiment of the present invention.
Figure 1B:
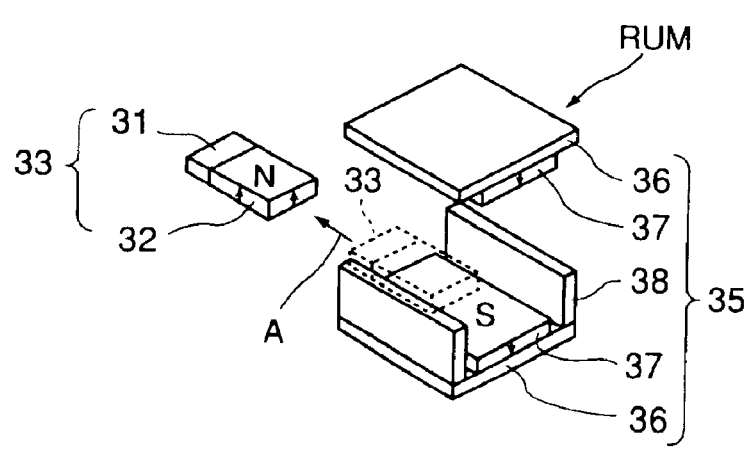
FIG. 1B is a perspective view of a repulsion magnet unit of this embodiment.

FIGS. 1A and 1B are perspective views, illustrating a moving stage device according to a first embodiment of the present invention. In this moving stage device, a base guide 1 is fixed to an unshown base, and the base guide 1 supports a stage 3 for carrying thereon a workpiece 2 for sliding movement in one axial direction relative to the base guide 1. The Z tilt motion of the stage 3 is restricted by means of an air slide which is defined between the top face of the base guide 1 and the bottom face of the stage 3. Rotation of the stage 3 about a Z axis which is in a direction perpendicular to or substantially perpendicular to an X-Y plane, as well as the position in X direction which is a direction orthogonal to or substantially orthogonal to a Y direction (movement direction) are restricted by means of an air slide defined between a side face of a yaw guide 4 and a side face of the base guide 1. Fixedly mounted at the opposite sides of the stage 3 are linear motor movable elements 5, each being disposed opposed to a linear motor stator 6 without contact thereto. Each stator 6 is fixed to an unshown base, through legs 7 at opposite ends thereof.

Figure 9:
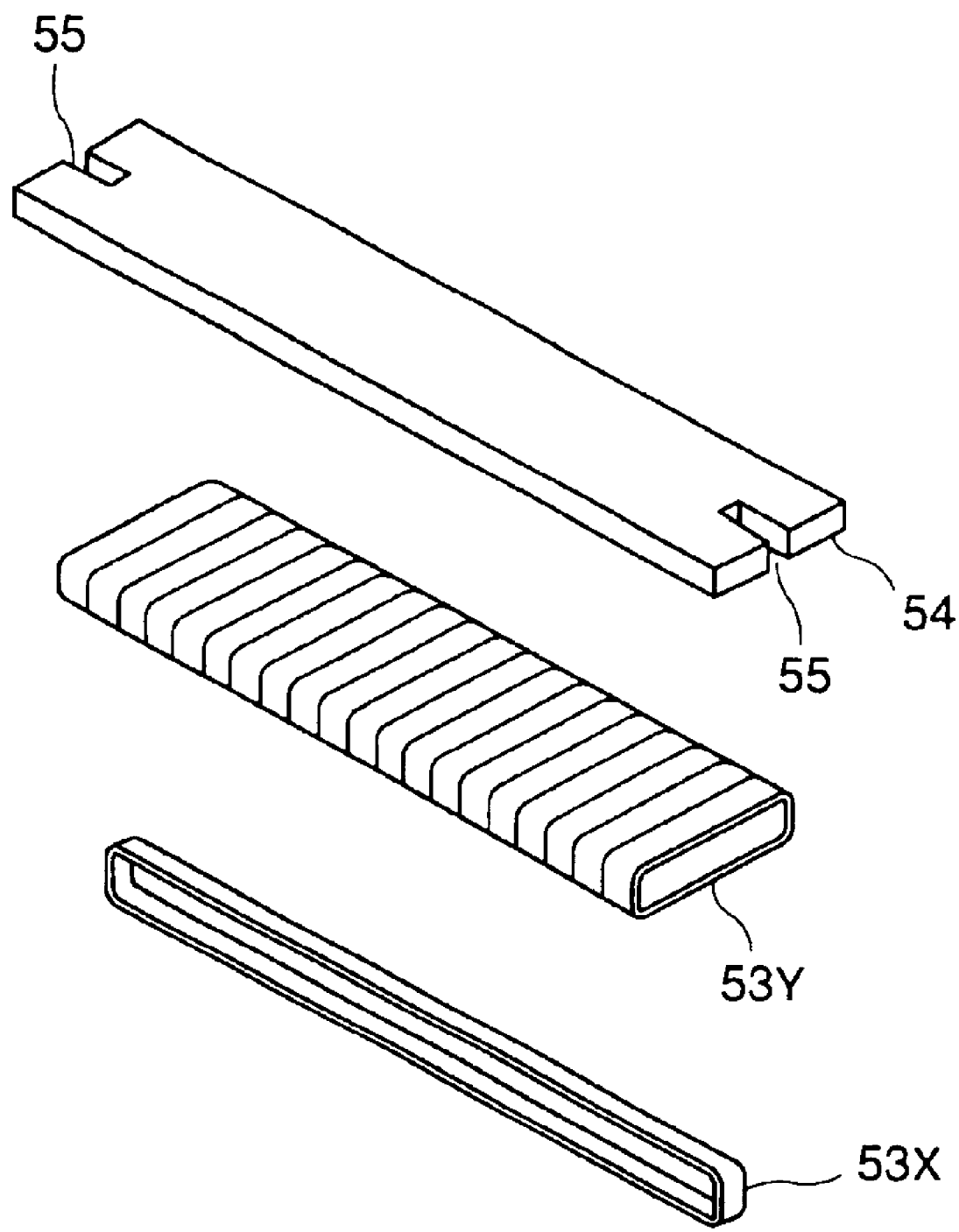
FIG. 9 is an exploded and perspective view of a stator of a single-phase linear motor in the third embodiment of the present invention.
Figure 10:
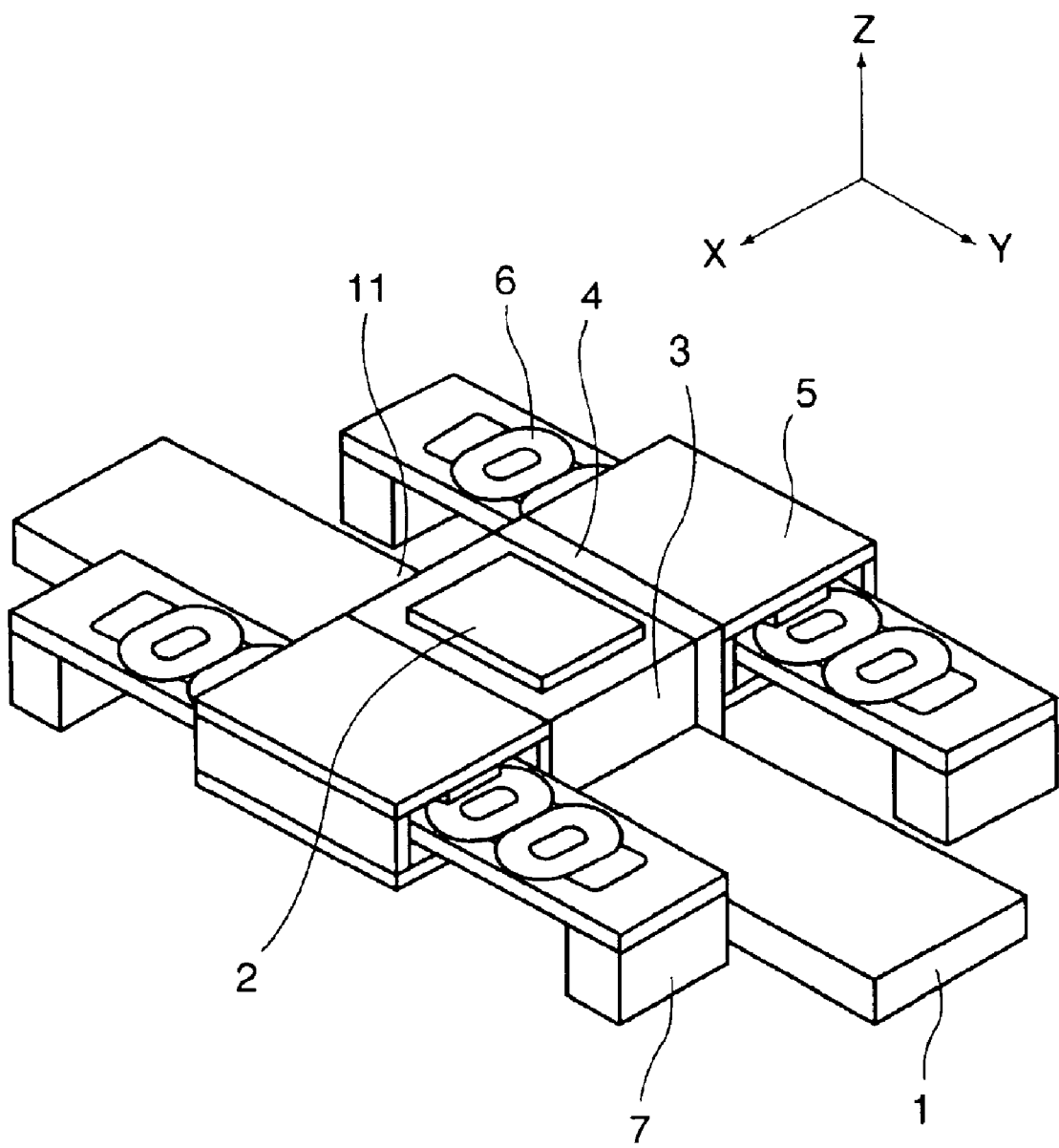
FIG. 10 is a perspective view of a conventional moving stage device.
Figure 11:
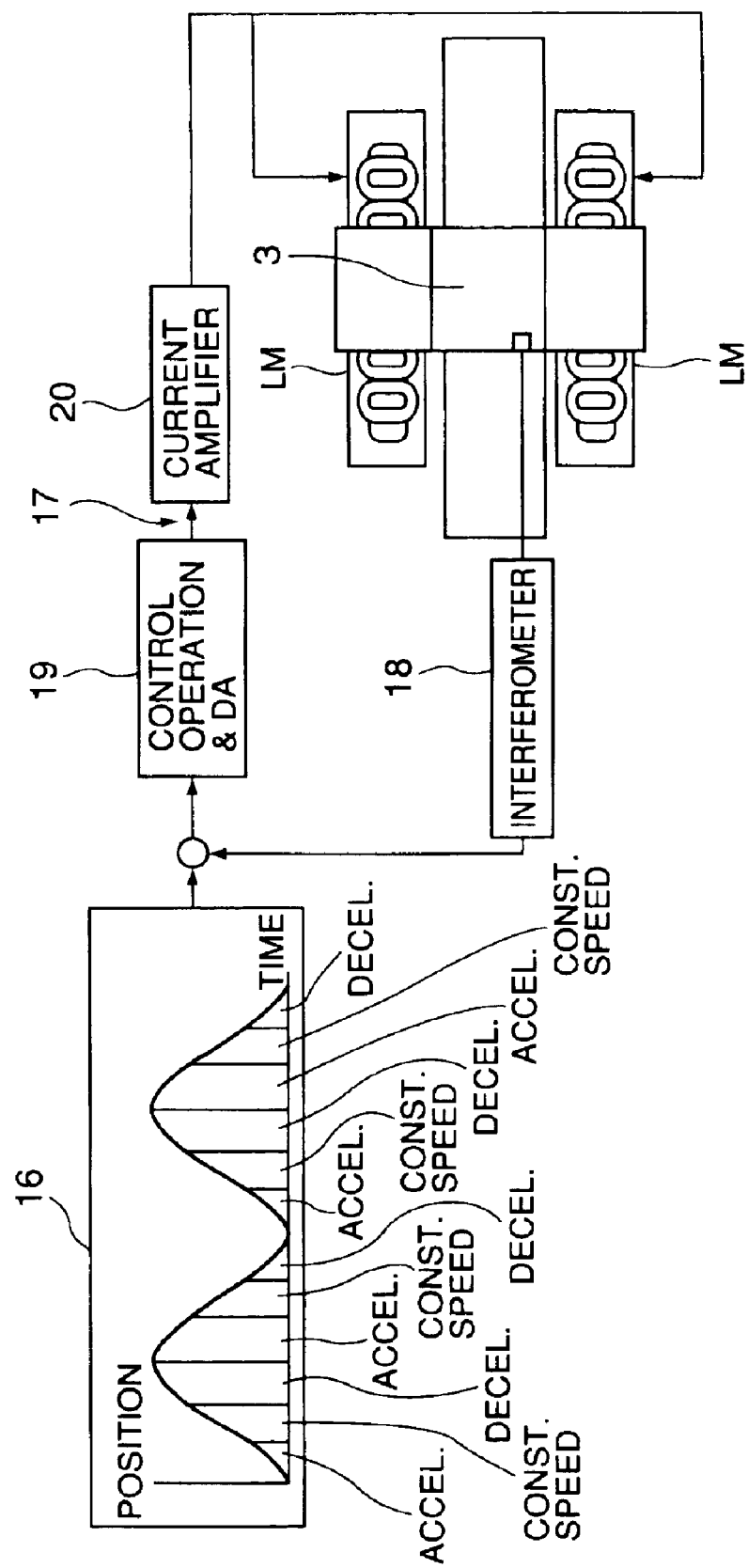
FIG. 11 is a block diagram of a conventional control system.
Figure 12A:
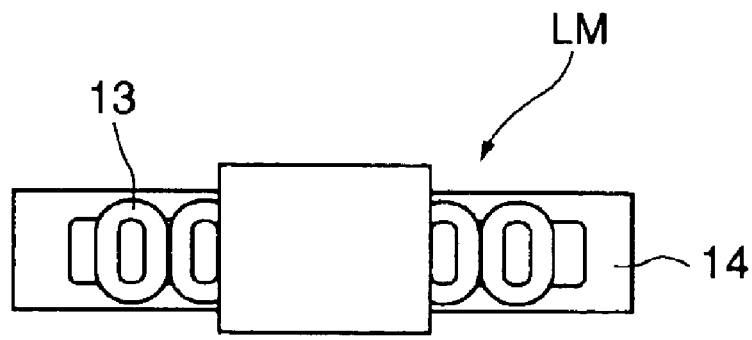
Figure 12B:
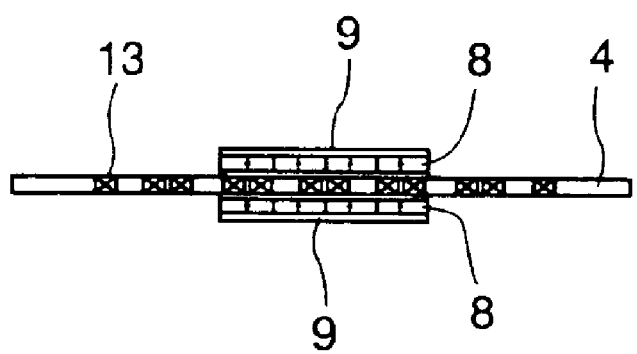
Figure 12C:
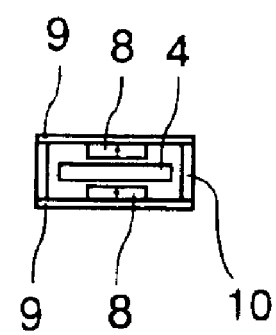
Figure 12D:
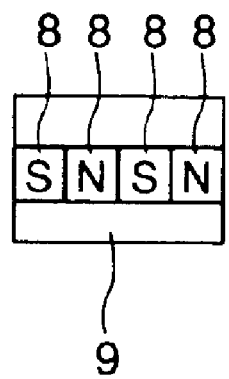

The linear motor is of the same type as shown in FIG. 9. The position of the stage 3 is measured by projecting a laser beam from a laser interferometer, upon a Y mirror 11.

The moving stage device is provided with a repulsion magnet unit RMU as best seen in FIG. 1B. Fixedly mounted in front of and behind the stage 3 are repulsion movable elements 33, respectively, each comprising a movable magnet holder 31 and a movable magnet 32. The movable magnet 32 is a plate-like single-pole permanent magnet, being magnetized in a vertical direction. In this embodiment, the N pole is at the top. The repulsion movable element 33 functions as an insert magnet and it interacts with a repulsion stator 35, fixed to the base guide 1, to apply a repulsive force to the stage 3, for acceleration and deceleration of the stage 3. As a matter of course, it may be arranged to have a function for, applying only one of acceleration and deceleration. Therefore, the words "acceleration and deceleration" may be used hereinafter to refer to "acceleration and/or deceleration".

The repulsion magnet unit RMU has a feature that the direction of repulsive force production is orthogonal to the magnetization direction of the permanent magnet. For example, a repulsive force in Y direction is obtainable if the same poles of magnets being magnetized in the Y direction are disposed opposed to each other. However, in that structure, the distance in which the repulsive force can be produced is very short so that a sufficient speed can not be reached.

As shown in FIGS. 1A and 1B, like-pole (same-pole) magnets are disposed opposed to each other to positively use a force to be produced in a direction perpendicular to the opposed direction. With this arrangement, a force producing stroke corresponding to the size of the like-pole magnets opposed is obtainable.

Further, in this repulsion magnet unit RMU, the magnetic pole faces of the movable magnet 32 are sandwiched from the opposite sides by the same poles of upper and lower magnets 37. This makes it possible to cancel the repulsive force in the opposed direction.

In association with the repulsion movable element 33 described above, the repulsion stator 35 for applying acceleration and deceleration force to the stage 3 is fixed to the base guide 1. More specifically, there are a pair of repulsion stator units 35 which are mounted at the opposite ends of the stroke of the stage 3, respectively.

Each repulsion stator 35 comprises a set magnet which includes an upper yoke 36, an upper magnet 37, side yokes 38 at opposite sides, a lower magnet 37, and a lower yoke 36. The upper and lower magnets 37 each comprises a plate-like single-pole permanent magnet, being magnetized in the vertical direction, like the repulsion movable element 33. However, these magnets are disposed so that the same pole as the movable element 33 is disposed opposed thereto. Namely, they are disposed so that the N pole is at the bottom face of the upper magnet 37 and the S pole is at the top face of the lower magnet 37.

The upper yoke 36, side yokes 38 and lower yoke 36 are provided for circulation, at the side, of the magnetic fluxes of the upper and lower magnets 37. Further, as regards the spacing between the upper and lower magnets 37, a spacing slightly larger than the thickness of the movable magnet 32 is defined. The inside spacing between the side yokes 38 is made slightly wider than the width of the movable magnet 32. Therefore, the movable magnet 32 can be inserted into the space defined between the pair of upper and lower magnets 37 and the pair of side yokes 38, without contact to them.

FIG. 1B is a perspective view, illustrating only one repulsion magnet unit (repulsion system). When the repulsion movable element 33 is at the position depicted by broken lines, a repulsive force in a direction of an arrow A is applied to it. As the movable element 33 is pushed in the direction of arrow A in response to the application of the repulsive force in the direction of arrow A, the repulsive force decreases gradually. When the repulsion movable element 33 becomes apart from the repulsion stator 35 by a certain distance, the repulsive force becomes null. At that moment, the stage 3 has been accelerated to its maximum speed and, since it is guided by an air slide, it continues constant-speed motion while keeping the speed. The same speed is kept until the repulsion movable element 33 provided at the opposite end of the stage 3 initiates interaction with the repulsion stator 35 also being provided at the other end.

In regard to any deceleration action due to air resistance or piping resistance, the linear motor produces a force to cancel the deceleration. Since the kinetic energy can be preserved until the repulsion movable element 33 provided at the opposite end of the stage 3 interacts with the repulsion stator 35 also being provided at the other end, as described above, the speed becomes null when the repulsion movable element 33 provided at the opposite end of the stage 3 is inserted into the repulsion stator 35 at the other end, by an amount the same as the insertion amount defined at the position depicted by the broken lines in FIG. 1B.

FIGS. 3A–3I illustrate the driving procedure according to the first embodiment.

Now, it is assumed that, as the power is turned on, the system is in the state shown in FIG. 1A. In this state, an electric current is applied to the linear motor LM to move the stage 3 leftwardly. FIG. 1B illustrates the position whereat the left-hand side repulsion movable element 33 and the left-hand side repulsion stator 35 initiate their interaction, that is, the position before which the left-hand side repulsion movable element 33 and the left-hand side repulsion stator 35 do not interact with each other. The electric current to be applied to the linear motor may be very weak.

The stage 3 is further moved leftwardly, and the left-hand side repulsion movable element 33 is inserted to between the upper and lower magnets 37 of the left-hand side repulsion stator 35. FIG. 1C illustrates this state, and an electric current is being applied to the linear motor to cope with the repulsive force. If the linear motor electric current is extinguished to zero in this state, the stage 3 is accelerated rightwardly by the repulsive force. Actually, the electric current to the linear motor LM is not null and, as will be described later, a very weak current is flown for high precision control of the position.

FIG. 1D illustrates the state that the acceleration has been completed and the maximum speed has been reached. This is the same position (FIG. 1B) of the repulsion movable element 33 relative to the repulsion stator 35. At the right-hand side of this position, the repulsive force to be applied to the stage from the left-hand side stator 35 is zero. After this, the stage 3 moves rightwardly at a constant speed, and it is brought into the state of FIG. 1E and then into the state of FIG. 1F.

The state of FIG. 1F depicts the position where the right-hand side repulsion movable element 33 starts receiving the repulsive force from the right-hand side repulsion stator 35. The relative distance between the repulsion movable element 33 and the repulsion stator 35 is the same as that in the state of FIG. 1B or 1D. From this position, the stage 3 decelerates while a force is applied thereto in the leftward direction, and the state of FIG. 1G is reached. At that moment, the speed of the stage 3 is zero. The interrelation between the right-hand side repulsion movable element 33 and the right-hand side repulsion stator 35, that is, the amount of insertion of the right-hand side repulsion movable element 33 into the right-hand side repulsion stator 35, is the same as that in the state of FIG. 1C.

The speed in this state is zero, but the repulsive force applied to the stage 3 is largest. From this state, the stage 3 starts leftward acceleration until the state of FIG. 1H is reached, where the speed become maximum. The position of the repulsion movable element 33 relative to the repulsion stator 35 in FIG. 1H is the same as that in FIG. 1F. At the left-hand side of this position, the repulsive force to be applied to the stage 3 is zero. In the similar manner, reciprocal motion is repeated.

Figure 2:
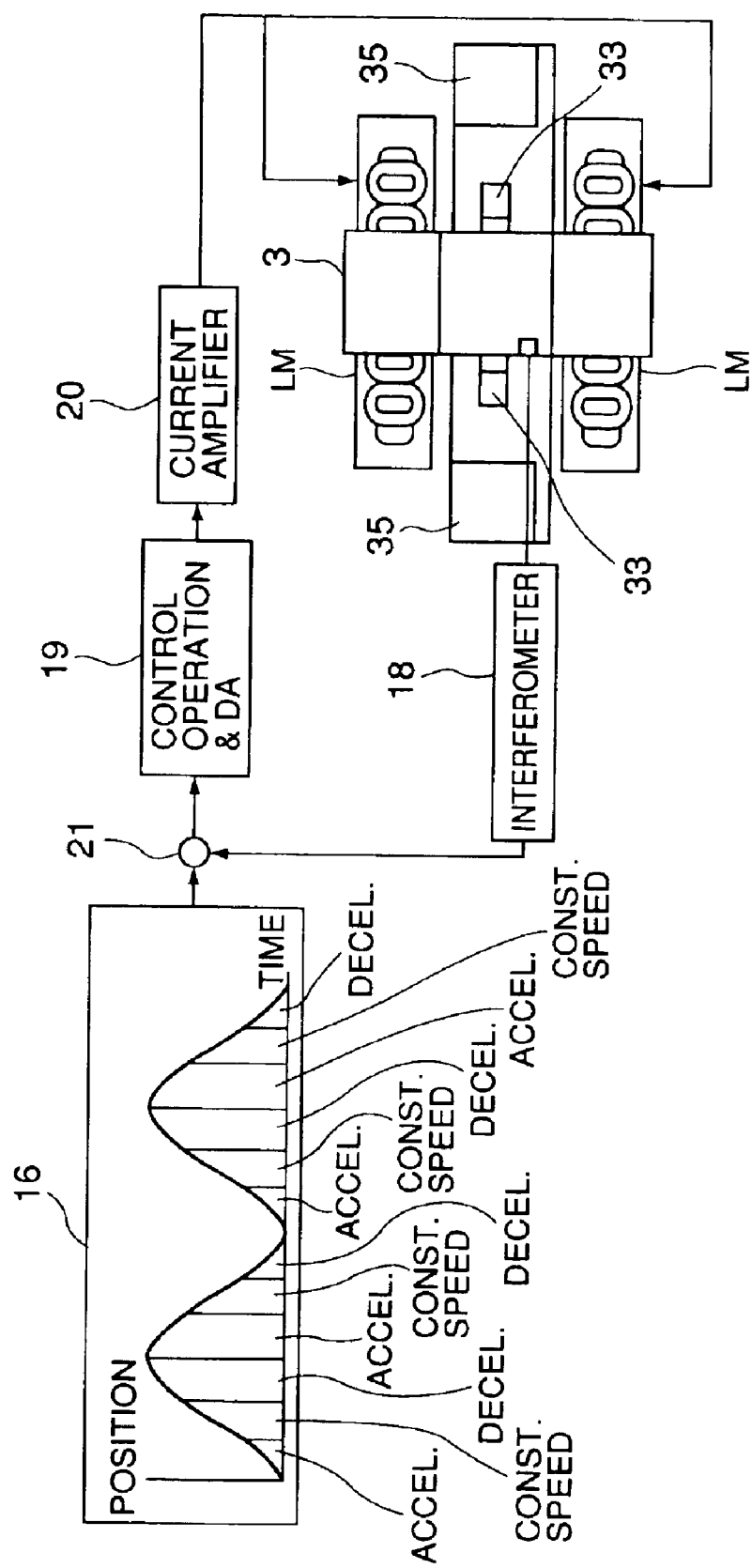
FIG. 2 is a block diagram of a control system of a moving stage device, according to the first embodiment of the present invention.
Figure 3A:
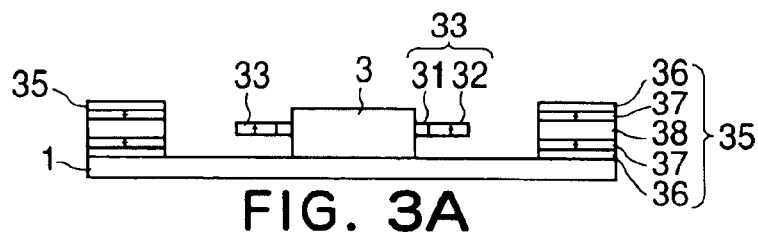
FIGS. 3A–3I are schematic views, respectively, for explaining driving procedure in the moving stage device according to the first embodiment of the present invention.
Figure 3B:
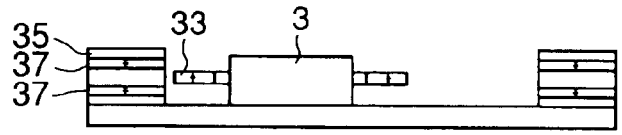
Figure 3C:
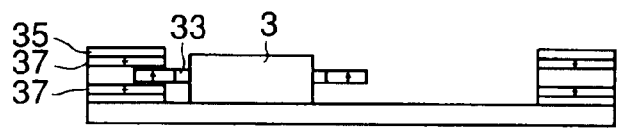
Figure 3D:
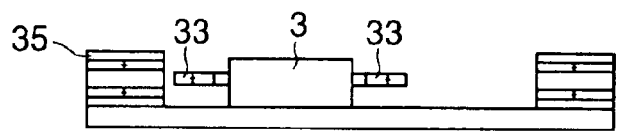
Figure 3E:
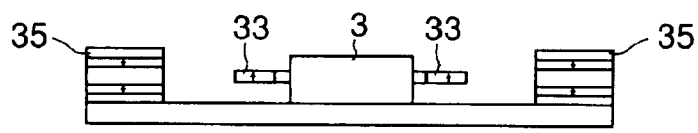
Figure 3F:
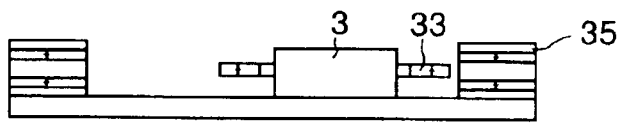
Figure 3G:
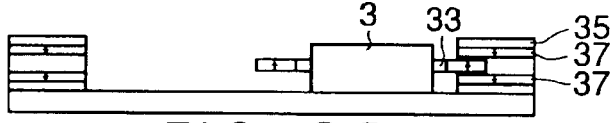
Figure 3H:
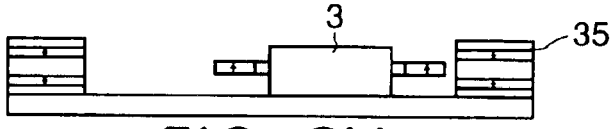
Figure 3I:
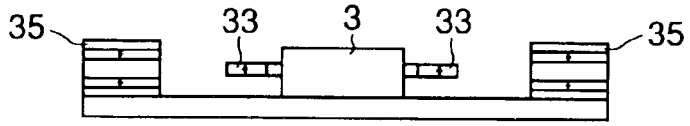

FIG. 2 is a block diagram of a control system according to the first embodiment. The control system comprises position profile generating means 16 for generating the relation between time and the position to be assumed at that time, a differential circuit 21 for calculating the difference between the position to be assumed at every moment and the actual position as measured by means of an interferometer, an operation unit 19 for performing a control operation as represented by PID operation, for example, to the difference outputted from the difference circuit 21, and for producing an output analogue voltage corresponding to the operation result, and an electric current amplifier 20 for supplying an electric current proportional to the analogue output voltage to the linear motor LM. With this arrangement, the position of the stage 3 is controlled to follow the position profile. This is an ordinary position servo system.

The position profile is applied so as to repeat reciprocal motion as has been explained with reference to FIG. 3. Although only two periods are illustrated, actually this is repeated. The block diagram itself of the control system is the same as the conventional example. However, in the conventional example, a large current is applied to the linear motor LM during acceleration and deceleration. In the first embodiment, as compared therewith, the force necessary for acceleration or deceleration is produced by the repulsion stator 35 and the repulsion movable element 33. Therefore, although the position being controlled is the same, yet almost no electric current flows through the linear motor LM. In the linear motor LM, after a thrust for inserting the repulsion movable element 33 into the repulsion stator 35 is first produced, it generates a very small thrust for correcting a small positional deviation with reference to a target position and, therefore, substantially no heat is produced thereby.

When the reciprocal motion is to be discontinued, an electric current is applied to the linear motor LM to stop the stage 3.

Second Embodiment

Figures 4A, 4B:
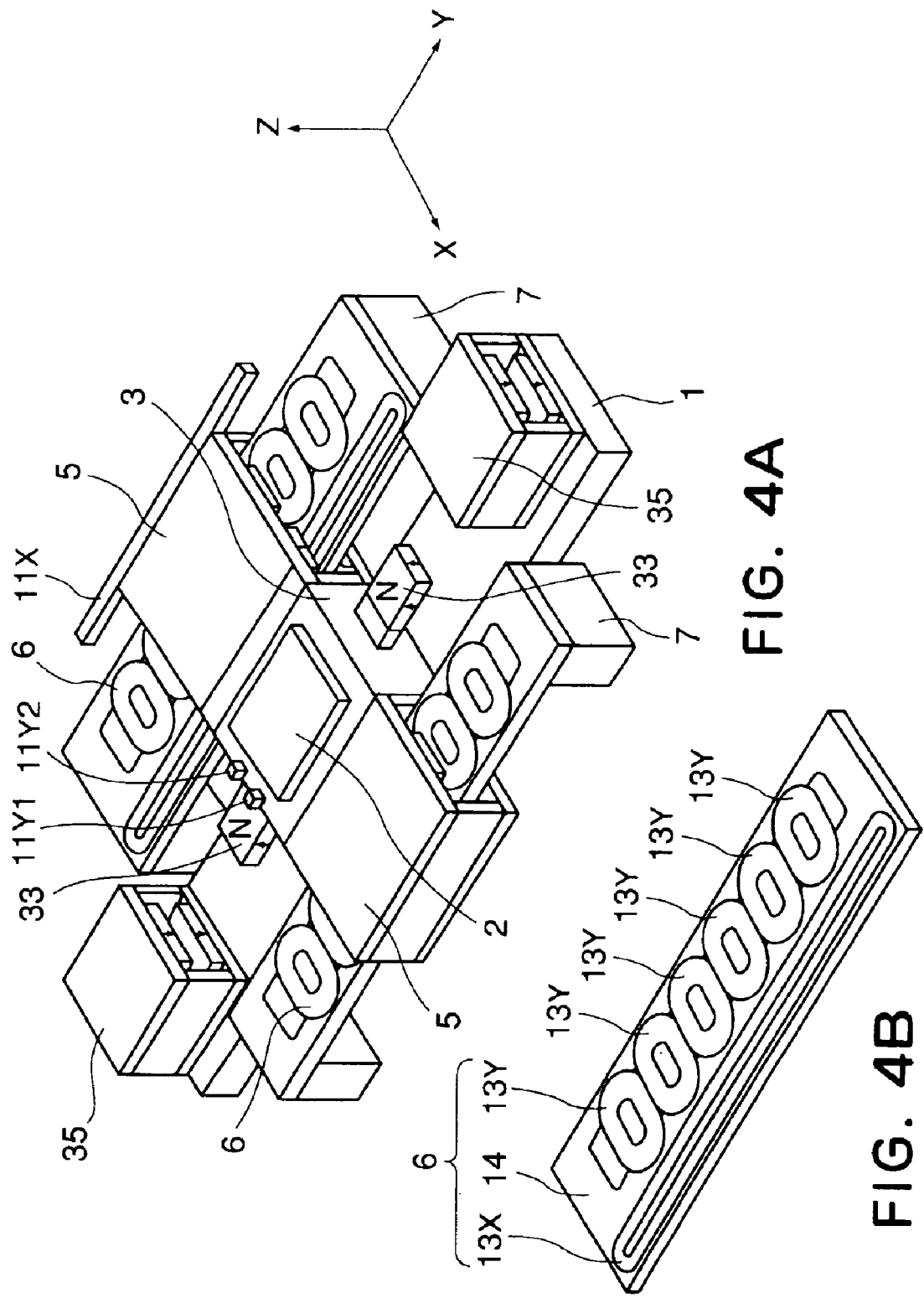
FIG. 4A is a perspective view of a moving stage device according to a second embodiment of the present invention.
FIG. 4B is a perspective view of a linear motor stator of this embodiment.

FIGS. 4A and 4B are perspective views, respectively, of a moving stage device according to a second embodiment of the present invention. In this moving stage device, a base guide 1 is fixed to an unshown base, and the base guide 1 supports a stage 3 for carrying thereon a workpiece 2 for sliding movement approximately in one axial direction relative to the base guide 1. The Z tilt motion of the stage 3 is restricted by means of an air slide which is defined between the top face of the base guide 1 and the bottom face of the stage 3. Rotation of the stage 3 about a Z axis and the position in X direction are not restricted, but they are free. However, the movable stroke is almost zero. Fixedly mounted at the opposite sides of the stage 3 are linear motor movable elements 5, each being disposed opposed to a linear motor stator 6 without contact thereto. Each stator 6 is fixed to an unshown base.

The linear motor shown at the front side as seen in the drawing has a similar structure as that of FIG. 1. The linear motor shown at the rear side in the drawing is arranged to produce a thrust in X direction, in addition to the structure shown in FIG. 1. FIGS. 5A–5D illustrate details. The stator 6 comprises a coil holder 14, six Y-axis flat coils 13Y, and one X-axis flat coil 13X. The movable element 5 comprises four-pole type Y driving magnets 8Y, two-pole type X driving magnets 8X, upper and lower yokes 9, and side plates 10 at opposite sides.

The portion for performing Y-axis driving has a similar structure as that of FIG. 9, and description thereof will be omitted here. The two-pole X driving magnets 8X are plate-like magnets being magnetized in the vertical direction. They are arrayed in X direction with their poles being oriented as seen in FIGS. 5A–5D. Generally, the central positions of these magnets are substantially registered with the central position of two straight portions of the X-axis flat coils 13X. When an electric current is applied to the coils 13X, a force in X direction is applied to the movable element 5.

The stage 3 is provided with Y mirrors 11Y1 and 11Y2, for detection of the position in Y direction. There is an X mirror 11X at a rear-side end of the movable element. The position of the stage 3 is measured by means of interferometers having laser beams to be projected to the Y mirrors 11Y1 and 11Y2 and the X mirror 11X. The interferometer associated with the Y mirrors 11Y1 and 11Y2 measures the position in the Y direction and rotation about the Z axis, while the interferometer associated with the X mirror 11X measures the position in the X direction.

The position control of the stage 3 in regard to Y direction and θ is carried out by applying an electric current to the six Y-axis flat coils 13Y in each of two units. The control of the stage 3 in X direction is carried out by applying an electric current to the X-axis flat coils 13X.

Fixedly mounted at the front side and rear side of the stage 3 are repulsion movable elements 33 each comprising a movable magnet holder 31 and a movable magnet 32. The movable magnet 32 is a plate-like single-pole permanent magnet being magnetized in the vertical direction, that is, the thickness direction. In this embodiment, the N pole is at the top and the S pole is at the bottom. This repulsion movable element 33 interacts with the repulsion stator 35 fixed to the stage guide 1 to apply a repulsive force to the stage 3, for acceleration and deceleration of the stage. This structure is completely the same as the first embodiment.

The driving method in relation to the reciprocal motion is the same in the first embodiment, and it is carried out in the manner shown in FIG. 3.

Figure 6:
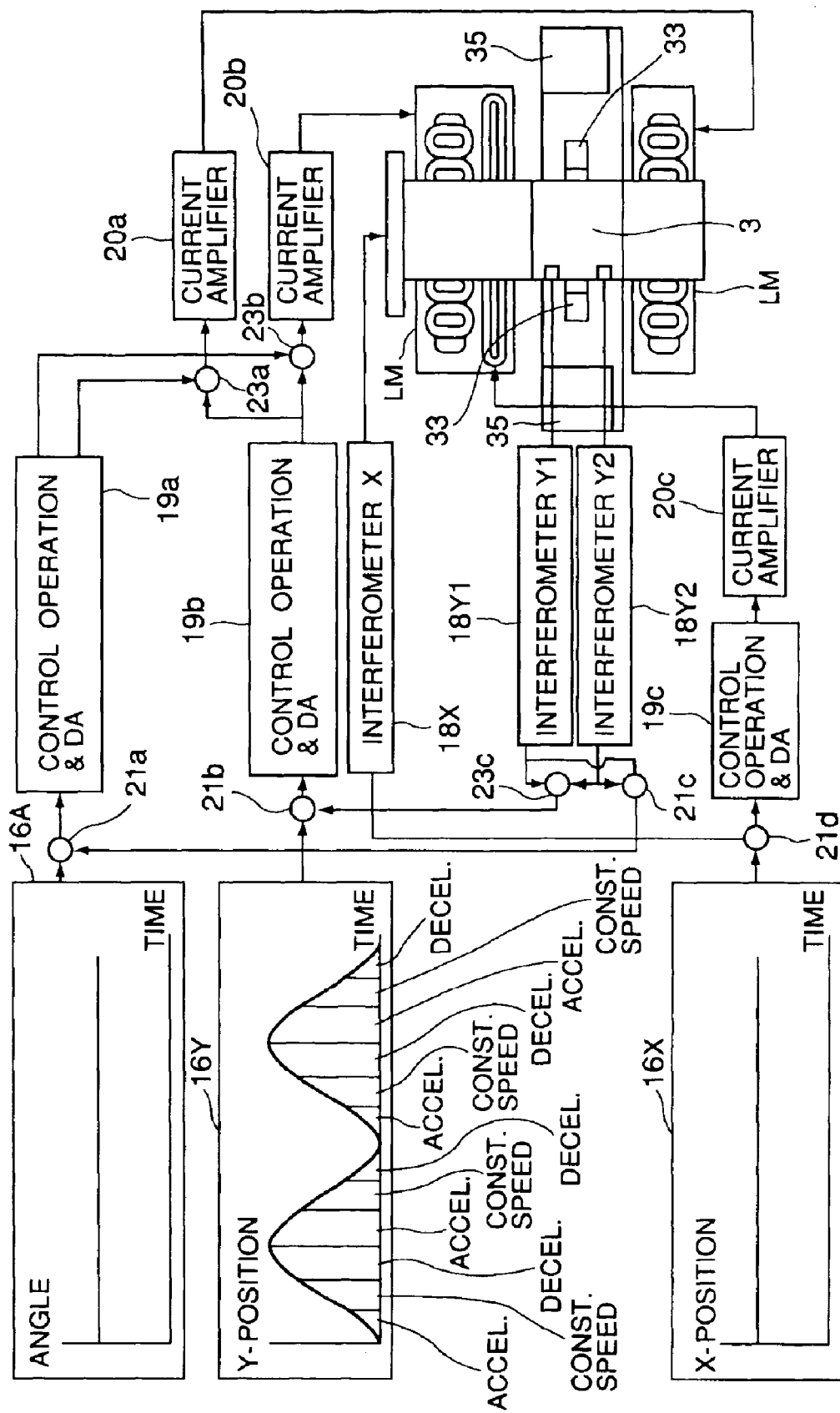
FIG. 6 is a block diagram of a control system of a moving stage device, according to the second embodiment of the present invention.

FIG. 6 illustrates a block diagram of the control system in this embodiment.

The control system comprises Y-position profile generating means 16Y for generating the relation between time and the Y-position to be assumed at that time, X-position profile generating means 16X for generating the relation between time and the X-position to be assumed at that time, and angular profile generating means 16A for generating the relation between time and the angle to be assumed at that time. These profiling means serves as a command for a Y-position servo system, a command for an X-position servo system, and a command for a θ-position servo system, respectively.

In the Y-position servo system, a differential circuit 21b calculates the difference between the Y profile and the actual Y-position at every moment. An operation unit 19b performs a control operation as represented by PID operation, for example, to the difference obtained, and it produces an output analogue voltage which is then applied to electric current amplifiers 20a and 20b for supplying electric currents to the Y-axis flat coils 13Y at the opposite sides. With this arrangement, the Y-position of the stage 3 is controlled to follow the Y-position profile. The actual Y-position is detectable by calculating an average of the measured values of the interferometers 11Y1 and 11Y2.

In the X-position servo system, a differential circuit 21d calculates the difference between the X profile and the actual X-position at every moment. An operation unit 19c performs a control operation as represented by PID operation, for example, to the difference obtained, and it produces an output analogue voltage which is then applied to an electric current amplifier 20c for supplying an electric current to the X-axis flat coil 13X. With this arrangement, the X-position of the stage 3 is controlled to follow the X-position profile. The actual X-position is detectable on the basis of the measured value of the interferometer 11X.

In the θ-position servo system, a differential circuit 21a calculates the difference between the θ profile and the actual θ position at every moment. An operation unit 19a performs a control operation as represented by PID operation, for example, to the difference obtained, and it produces an output analogue voltage which is then applied to adding circuits 23a and 23b and then to electric current amplifiers 20a and 20b, respectively, for supplying electric currents to the Y-axis flat coils 13Y at the opposite sides. With this arrangement, the θ-position of the stage 3 is controlled to follow the θ-position profile. The analogue voltages are applied to the left-hand and right-hand current amplifiers with opposite signs. The actual θ-position is detectable by calculating a difference, through a differential circuit 21c, between the measured values of the interferometers 11Y1 and 11Y2.

The systems described above are ordinary X, Y and θ position servo systems. The Y position profile is applied so as to repeat reciprocal motion as has been explained with reference to FIG. 3. Although only two periods are illustrated, actually this is repeated.

In this embodiment, the θ-position profile is applied in terms of a profile being constant with respect to time.

In the conventional example, a large electric current is applied to the linear motor LM during acceleration and deceleration in the Y-direction. In this embodiment, as compared therewith, the force necessary for acceleration or deceleration in the Y direction is produced by the repulsion stator 35 and the repulsion movable element 33. Therefore, almost no electric current flows through the linear motor LM. In the linear motor LM, after a thrust for inserting the repulsion movable element 33 into the repulsion stator 35 is first produced, it generates a very small thrust for correcting a small positional deviation with reference to a target position and, therefore, substantially no heat is produced thereby. This is essentially the same as the first embodiment.

No large acceleration is produced with regard to the X direction and θ direction. It is a quite ordinary servo system. Also, when the repulsion movable element 33 is going to be inserted into the repulsion stator 35, the control is made to keep the X and θ positions constant. If at this time there is no control error, no force in the X and θ directions is produced in the repulsion movable element 33. Actually, however, there is a small error and, in accordance with this error, forces in X diction and θ direction are produced in the repulsion stator 35 and the repulsion movable element 33. This can be met by an electric current applied to the X-axis flat coils 13X, as well as electric currents applied to the Y-axis flat coils 13Y1 and 13Y2 to produce forces in opposite direction along the Y direction. The amount of currents is very small, and it causes almost no heat generation.

When the reciprocal motion is to be discontinued, an electric current is applied to the linear motor LM as desired to stop the stage 3.

Third Embodiment

Figure 7:
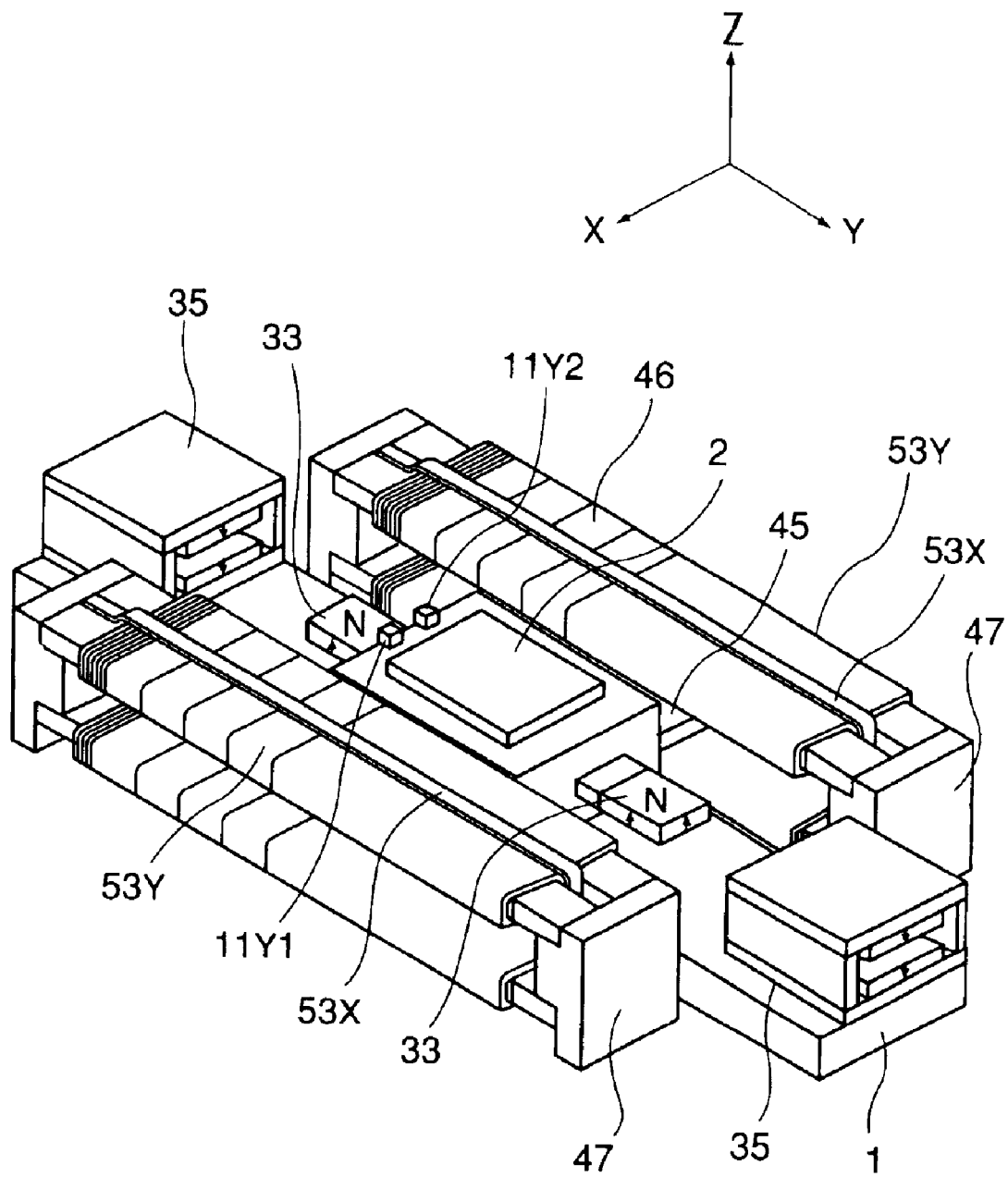
FIG. 7 is a perspective view of a moving stage device according to a third embodiment of the present invention.
Figure 8:
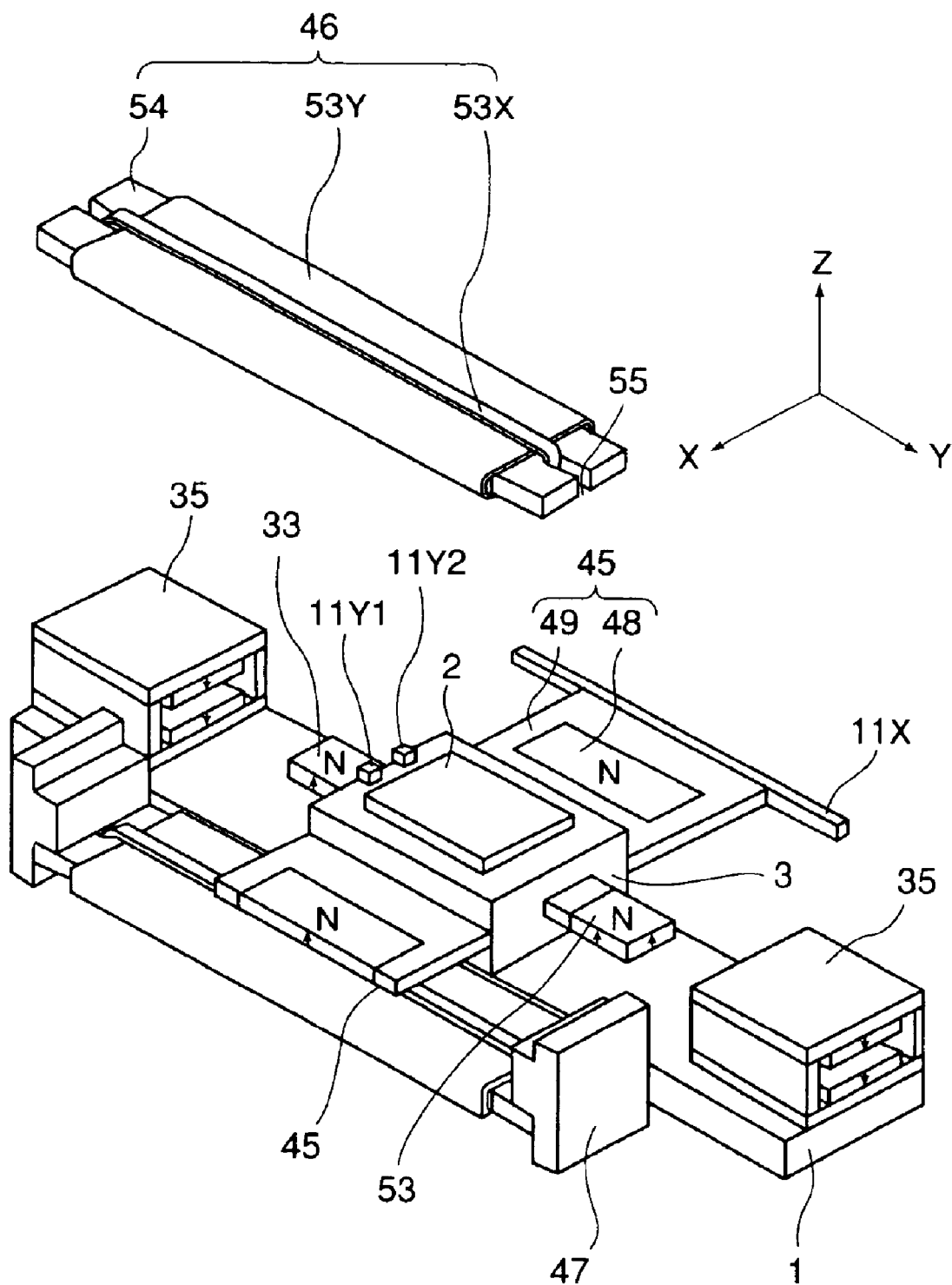
FIG. 8 is an exploded and perspective view of a main portion of the moving stage device according to the third embodiment of the present invention.

FIGS. 7, 8, and 9 are perspective views, respectively, illustrating a third embodiment of the present invention.

In this moving stage device, a base guide 1 is fixed to an unshown base, and the base guide 1 supports a stage 3 for carrying thereon a workpiece 2 for sliding movement approximately in one axial direction relative to the base guide 1. The Z tilt motion of the stage 3 is restricted by means of an air slide which is defined between the top face of the base guide 1 and the bottom face of the stage 3.

Rotation of the stage 3 about a Z axis and the position in X direction are not restricted, but they are free. However, the movable stroke is almost zero. Fixedly mounted at the opposite sides of the stage 3 are dual-axis single-phase linear motor movable elements 45. Each of these movable elements is disposed opposed to a pair of linear motor stators 46 without contact thereto, in the manner that the stators 46 sandwich the movable element 45 in the vertical direction. The linear motor stators 46 are fixed to an unshown base, through legs 47.

The stage 3 is provided with Y mirrors 11Y1 and 11Y2. There is an X mirror 11X at a rear-side end of the movable element 45. The position of the stage 3 is measured by means of interferometers having laser beams to be projected to the Y mirrors 11Y1 and 11Y2 and the X mirror 11X. The interferometer associated with the Y mirrors 11Y1 and 11Y2 measures the position in the Y direction and rotation about the Z axis, while the interferometer associated with the X mirror 11X measures the position in the X direction.

In the conventional example and the first and second embodiments described hereinbefore, the Y-axis driving linear motor operates to selectively drive plural flat coils. As compared therewith, this embodiment uses four driving coils which are always used simultaneously. In other words, there is no switching.

The linear motor movable element 45 comprises, as best seen in FIG. 8, a plate-like single-pole movable magnet 48 which is magnetized in the vertical direction, that is, the thickness direction, and which is mounted on a movable magnet holder 49. This unit produces a magnetic flux density in the vertical direction.

As shown in FIG. 7, as regards the linear motor stator 46, there are four units, that is, upper, lower, left-hand and right-hand units. Each of these units comprises, as best seen in FIGS. 8 and 9, a yoke 54, a Y single-phase coil 53Y and an X single-phase coil 53X. The Y single-phase coil 53Y comprises a wound wire, being wound about Y-axis relative to the yoke 54. The X single-phase coil 53X comprises a wound wire, being wound through a longitudinal groove 55 at the opposite ends of the yoke 54 and around the X axis.

When an electric current is applied to the Y single-phase coil 53 in the state in which the movable element 45 and the stator 46 are opposed to each other, a force in the Y direction is produced in the movable element 45. When an electric current is applied to the X single-phase coil 53X, a force in the X direction is produced in the movable element 45.

All the four X single-phase coils 53X are connected in series or in parallel, and electrically they provide a single phase.

In each of the four X single-phase coils 53X, and at the right-hand side and left-hand side thereof, respectively, the Y single-phase coils in the upper or lower array are connected in series or in parallel. However, in the right-hand and left-hand arrays, electric currents are applied independently of each other. Therefore, in regard to the Y direction, forces can be produced independently at the left-hand and right-hand arrays.

The Y and θ position control for the stage 3 is performed by applying electric currents to the left-hand side and right-hand side Y single-phase coils 53Y. The control of the stage in X direction is carried out by applying an electric current to the X single-phase coils 53X.

Fixedly mounted at the front side and rear side of the stage 3 are repulsion movable elements 33 each comprising a movable magnet holder 31 and a movable magnet 32. The movable magnet 32 is a plate-like single-pole permanent magnet being magnetized in the vertical direction, that is, the thickness direction. In this embodiment, the N pole is at the top and the S pole is at the bottom. This repulsion movable element 33 interacts with the repulsion stator 35 fixed to the stage guide 1 to apply a repulsive force to the stage 3, for acceleration and deceleration of the stage. This structure is completely the same as the first embodiment.

The driving method in relation to the reciprocal motion is the same in the first embodiment, and it is carried out in the manner shown in FIG. 3.

The block diagram of the control system of this embodiment will be omitted, but is may be similar to that of FIG. 6. It differs in that an electric amplifier of an X position servo system is connected to the X single-phase coils 53X, in place of the X flat coils 13X, and two current amplifiers of the Y and θ position servo systems are connected to the left-hand side and right-hand side Y single-phase coils 53Y in place of being connected to the left-hand side and right-hand side six flat coil systems. The remaining portion has similar structure and similar function as the preceding example.

This embodiment provides peculiar advantageous effects that the movable element 45 is light in weight and the stage as a whole is light in weight, and that, since there is no coil switching during Y-direction control, the position control precision is improved.

Fourth Embodiment

Where the present invention is applied to a reticle stage of a semiconductor exposure apparatus, in the first to third embodiments the amount of insertion (FIG. 3C) may be changed to change the maximum speed. More specifically, if it is desired to change the dose amount in the exposure process, the amount of insertion of the repulsion movable element into the repulsion stator 35 (FIG. 3C) may be changed.

Further, there may be cases wherein the whole pattern of a reticle (original) should not be transferred, that is, only a half or a part of it should be transferred. In the first to third embodiments, the repulsion stator 35 has been explained as being fixed in position. However, the position of the repulsion stator may be made variable by use of a well-known screw feeding mechanism, for example. In that occasion, the movable stroke of the stage 3 can be set as desired, and this can meet the case where only a portion of the reticle should be transferred.

Fifth Embodiment

Figure 13:
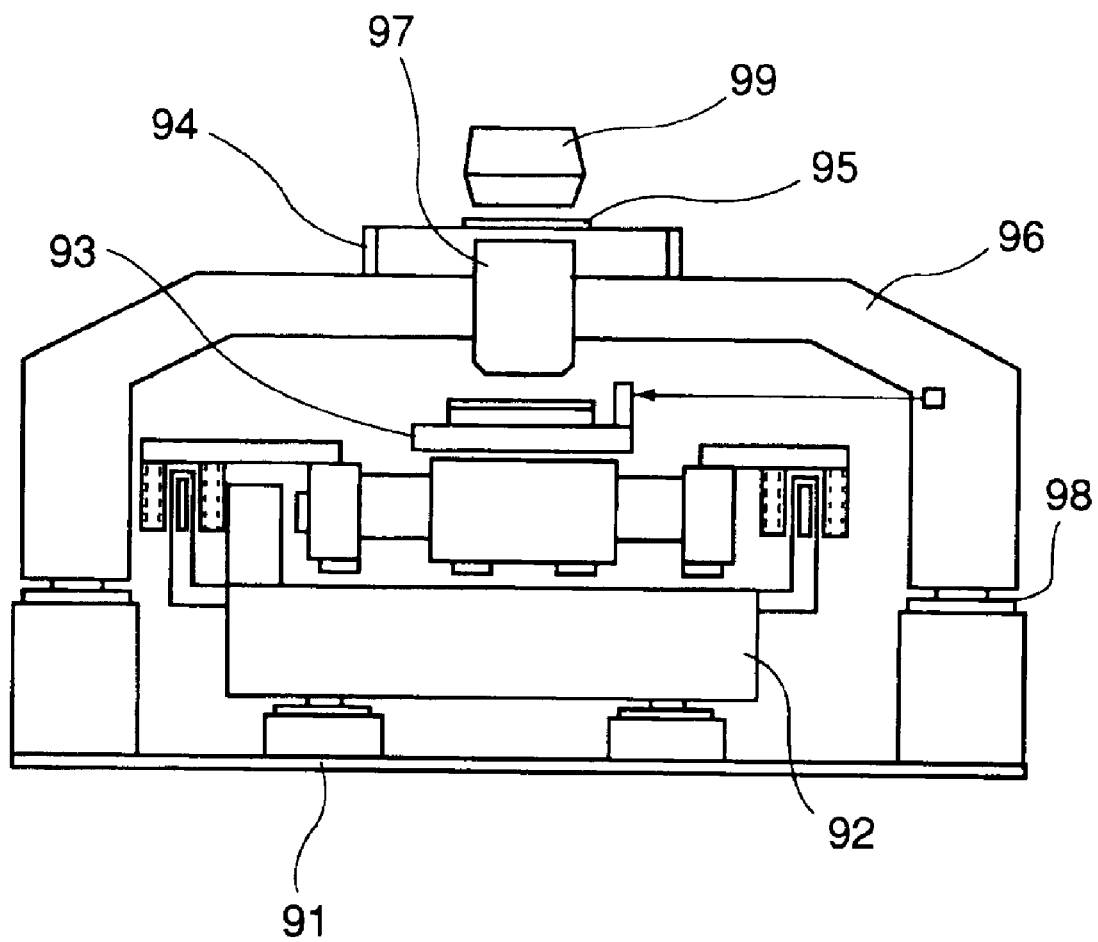
FIG. 13 is an elevational view of an exposure apparatus according to an embodiment of the present invention.

Referring now to FIG. 13, an embodiment of a scanning exposure apparatus in which a moving stage device according to any one of the preceding embodiments is incorporated as a reticle stage, will be explained.

A barrel base 96 is supported by a floor or a base table 91 through dampers 98. Further, the barrel base 96 supports a reticle stage base 94 as well as a projection optical system 97 which is positioned between a reticle stage 95 and a wafer stage 93.

The wafer stage 93 is supported by a stage base 92 supported by the floor or the base table 91, and it functions to carry a wafer thereon and to perform positioning of the same. The reticle stage 95 is supported by a reticle stage base 94 supported by the barrel base 96, and it is movable while carrying thereon a reticle having a circuit pattern formed thereon. An illumination optical system 99 produces exposure light with which the wafer on the wafer stage can be exposed to the reticle placed on the reticle stage 95.

The wafer stage 93 is scanningly moved in synchronism with the reticle stage 95. During scan of the reticle stage 95 and the wafer stage 93, the positions of them are continuously detected by means of associated interferometers, respectively, and the detected positions are fed back to driving units for the reticle stage 95 and the wafer stage 93, respectively. With this arrangement, the scan start positions of theses stages can be exactly synchronized with each other and, additionally, the scan speed in the constant-speed region can be controlled very precisely. During the period in which the reticle stage and the wafer stage are scanningly moved relatively to the projection optical system 97, the wafer is exposed to the reticle pattern such that a circuit pattern is transferred onto the wafer.

In this embodiment, a moving stage device according to any one of the preceding embodiments is used as a reticle stage. Therefore, high-speed and high-precision exposure process is accomplished, without being influenced by simple harmonic oscillation.

Embodiment of Semiconductor Manufacturing System

Next, an embodiment of a manufacturing system for semiconductor devices such as semiconductor chips (e.g., IC or LSI), liquid crystal panels, CCDs, thin film magnetic heads, or micro-machines, for example, will be described. This system is arranged so that repair of any disorder occurring in a production machine placed in a semiconductor manufacturing factory or periodic maintenance thereof or, alternatively, a maintenance service such as software supply, can be made by use of a computer network outside the manufacturing factory.

Figure 14:
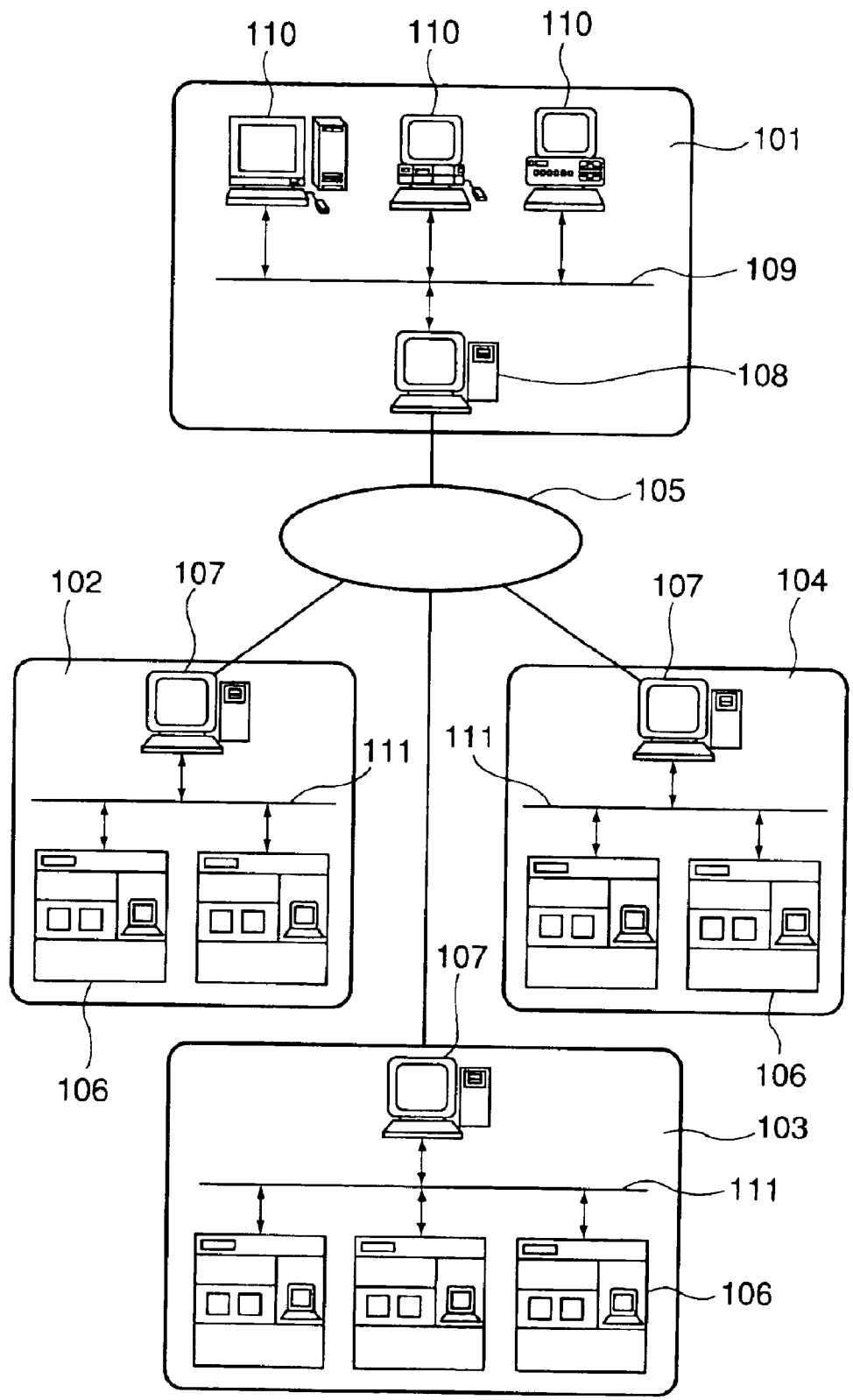
FIG. 14 is a schematic view of a semiconductor device manufacturing system, as viewed in a certain aspect thereof.

FIG. 14 is a schematic view of a general structure of the production system, in a certain aspect thereof. Denoted in the drawing at 101 is a business office of a vendor (machine supplying maker) for providing semiconductor device manufacturing apparatuses. As examples of such production machines, here, pre-process machines (various lithographic apparatuses such as an exposure apparatus, a resist coating apparatus, an etching apparatus, for example, as well as a heat treatment apparatus, a film forming apparatus, and a flattening apparatus) and post-process machines (an assembling machine and an inspection machine, for example) are assumed. Inside the business office 101, there are a host control system 108 for providing maintenance database for the production machines, plural operating terminal computers 110, and a local area network (LAN) 109 for connecting them to constitute an intranet. The host control system 108 is provided with a gateway for connecting the LAN 109 to an internet 105 which is an outside network of the office, and a security function for restricting the access from the outside.

On the other hand, denoted at 102–104 are plural manufacturing factories of a semiconductor manufacturer or manufacturers as a user (users) of production machines. The factories 102–104 may be those which belong to different manufacturers or to the same manufacturer (e.g., they may be a pre-process factory and a post-process factory). In each factories 102–104, there are production machines 106, a local area network (LAN) 111 for connecting them to constitute an intranet, and a host control system 107 as a monitoring system for monitoring the state of operation of the production machines 106. The host control system 107 in each factory 102–104 is provided with a gateway for connecting the LAN 111 in the factory to the internet 105 which is an outside network of the factory. With this structure, the host control system 108 of the vendor 101 can be accessed from the LAN 111 in each factory, through the internet 105. Further, due to the security function of the host control system 108, only admitted users can access thereto. More specifically, through the internet 105, status information representing the state of operation of the production machines 106 (for example, the state of the machine in which any disorder has occurred) may be transmitted as a notice from the factory to the vendor. Additionally, any response information which is responsive to the notice (that is, for example, information on how the disorder should be treated or software data concerning the treatment) as well as a latest software program and maintenance information such as help information, may be supplied from the vendor. The data communication between each factory 102–104 and the vendor 101 as well as the data communication through the LAN 111 in each factory, may use a communication protocol (TCP/IP) generally used in the internet.

In place of using the internet, an exclusive line network (e.g., ISDN) controlled with a strictest security that an access of a third party is not allowed, may be used. Further, the host control system is not limited to the system as provided by the vendor. A database may be structured by the user and it may be set in an outside network, such that it can be accessed from plural user factories.

Figure 15:
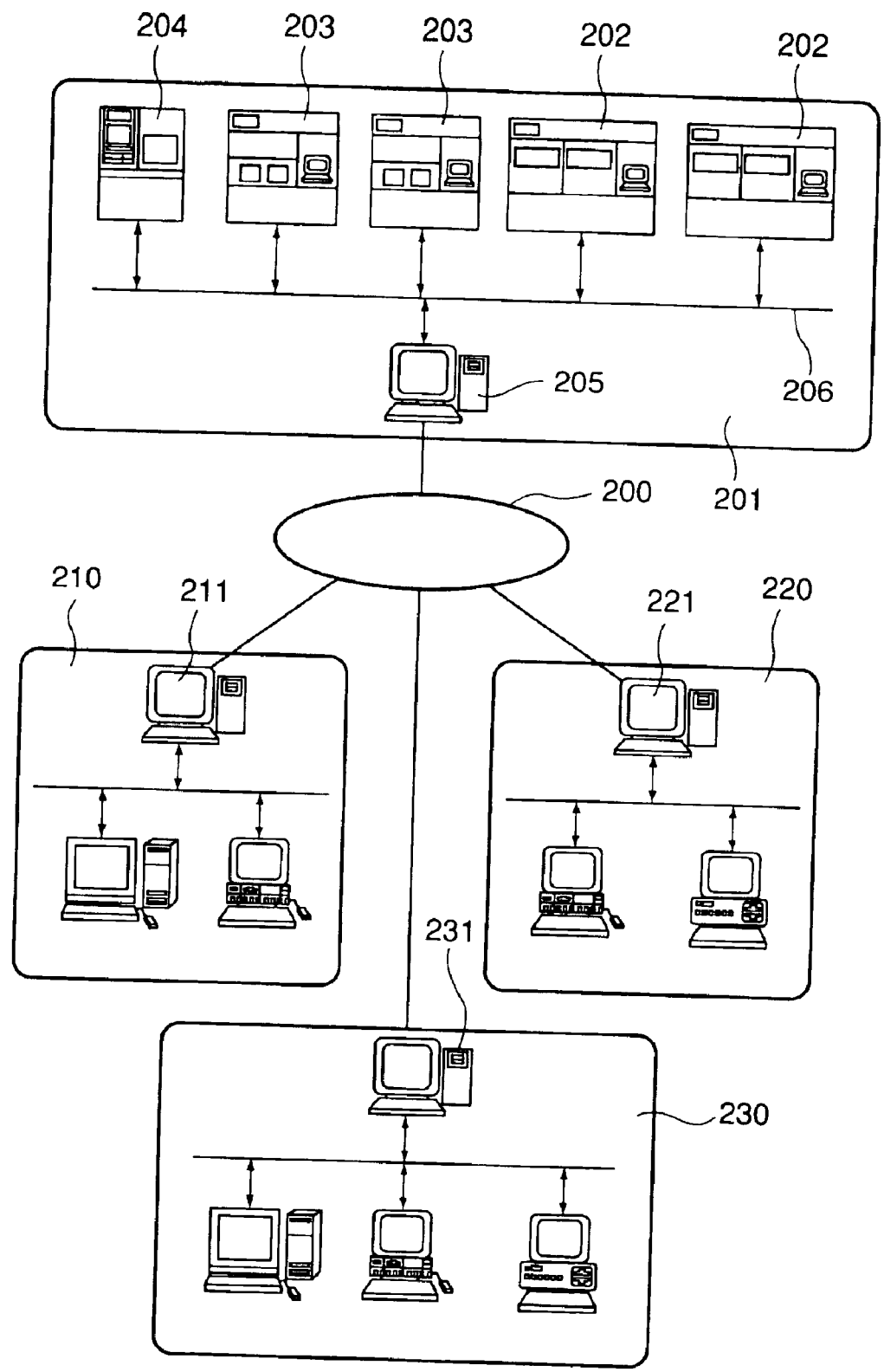
FIG. 15 is a schematic view of a semiconductor device manufacturing system, as viewed in another aspect thereof.

FIG. 15 is a schematic view of a general structure of the production system according to this embodiment, in another aspect thereof different from that of FIG. 14. In the preceding example, plural user factories each having production machines and the control system of the vendor of the production machines are connected with each other through an external network, so that, through this external network, information related to the production control in each factory or information related to at least one production machine can be data communicated. In this example, as compared therewith, a factory having production machines supplied from different vendors and control systems of these vendors corresponding to the user production machines are connected with each other through an external network, outside the factory, so that the maintenance information for these production machines can be data communicated.

Denoted in the drawing at 201 is a manufacturing factory of a production machine user (i.e., a semiconductor device manufacturer). Along the production line in the factory, there are many production machines for performing various processes, that is, in this example, an exposure apparatus 202, a resist processing apparatus 203, and a film formation processing apparatus 204 introduced. Although only one factory 201 is illustrated in the drawing, in practice, plural factories may be arranged into the network. Each production machine in the factory is connected through a LAN 206 to constitute an intranet. The operation of the production line is controlled by a host control system 205.

On the other hand, in the business offices of vendors (machine supplying makers) such as an exposure apparatus manufacturer 210, a resist processing machine manufacturer 220, and a film forming machine manufacturer 230, for example, there are host control systems 211, 221 and 213 for performing remote control maintenance for the machines they supplied.

Each of these host control systems is equipped with a maintenance database and a gateway for the outside network. The host control system 205 for controlling the machines in the user factory and the control systems 211, 221 and 231 of the machine vendors are connected with each other through the external network 200 (internet) or an exclusive line network. If, in this production system, any disorder occurs in any one of the production machines in the production line, the operation of the production machine is stopped. However, this can be met quickly through the remote control maintenance for the disordered machine, from the corresponding machine vendor and by way of the internet 200. Therefore, the suspension of the production line is short.

Figure 16:
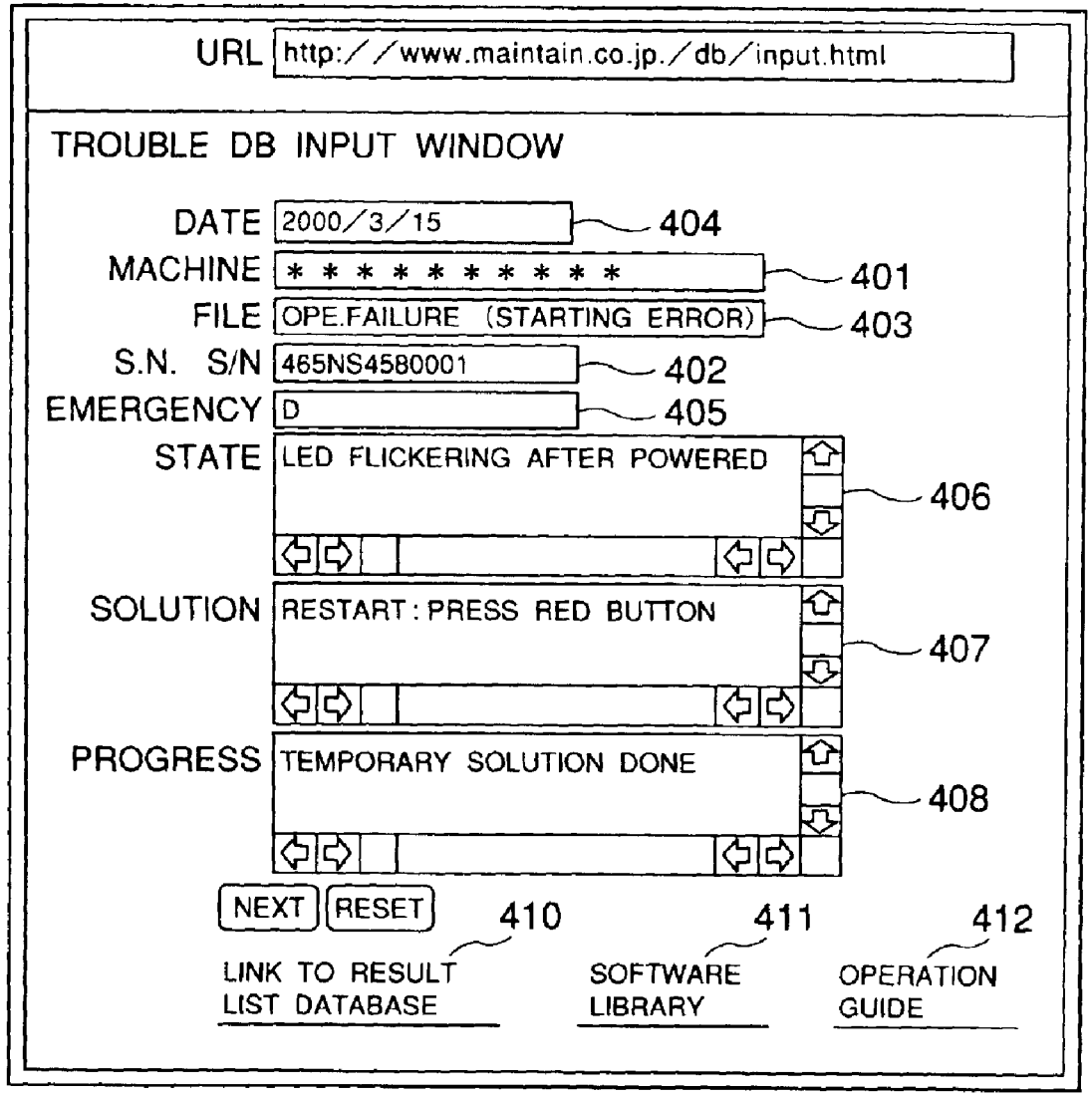
FIG. 16 is a schematic view for explaining an example of a user interface.

Each of the production machines in the factory may have a display, a network interface and a computer for executing network accessing softwares, stored in a storage device, as well as machine operating softwares. The storage device may be an internal memory or a hard disk or, alternatively, it may be a network file server. The network accessing softwares may include an exclusive or wide-use web browser, and a user screen interface such as shown in FIG. 16, for example, may be provided on the display.

Various data may be inputted into the computer (input zones on the screen) by an operator who controls the production machines in each factory, such as, for example, machine type (401), serial number (402), trouble file name (403), date of disorder (404), emergency level (405), status (406), solution or treatment (407), and progress (408). The thus inputted information is transmitted to the maintenance database through the internet. In response, appropriate maintenance information is replied from the maintenance database to the user's display. Further, the user interface as provided by the web browser enables a hyperlink function (410–412) as illustrated. As a result, the operator can access further details of information in each items, or he/she can get latest version software to be used for the production machine, from the software library as provided by the vendor. Alternatively, the operator can get an operation guide (help information) prepared for factory operators.

Here, the maintenance information provided by the maintenance database may include information related to the present invention as described above, and the aforementioned software library may provide latest software necessary for accomplishing the present invention.

Next, a semiconductor device manufacturing process which uses the production system described above, will be explained.

Figure 17:
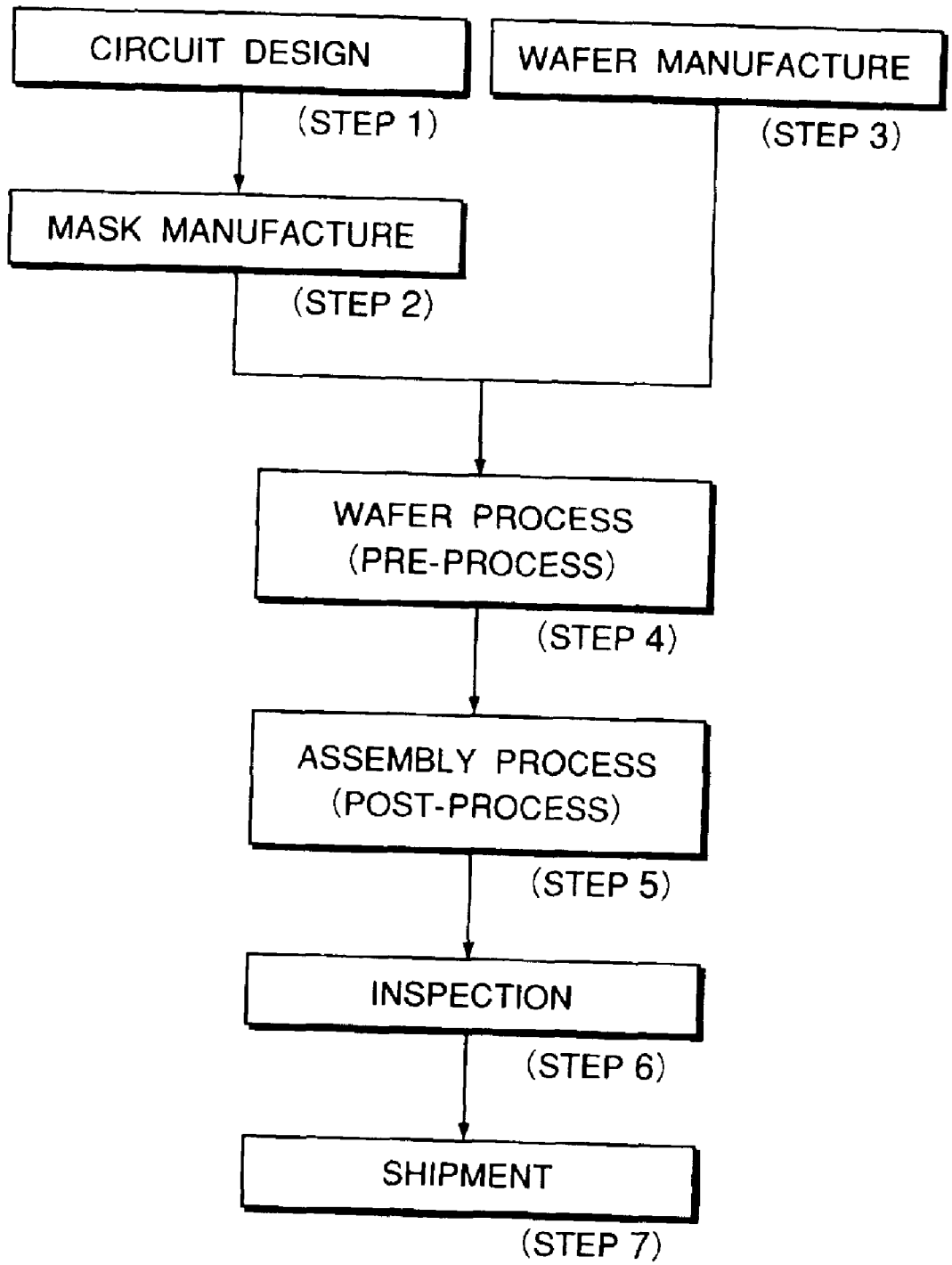
FIG. 17 is a flow chart for explaining device manufacturing processes.

FIG. 17 is a flow chart of a general procedure for manufacture of microdevices.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein operation check, durability check and so on for the semiconductor devices provided by step 5, are carried out. With these processes, semiconductor devices are completed and they are shipped (step 7).

The pre-process and the post-process may be performed in separate exclusive factories. In each factory, the maintenance is carried out on the basis of the remote maintenance system described hereinbefore. Further, between the pre-process factory and the post-process factory, data communication for the information related to the production control and the machine maintenance may be done by use of the internet or an exclusive line network.

Figure 18:
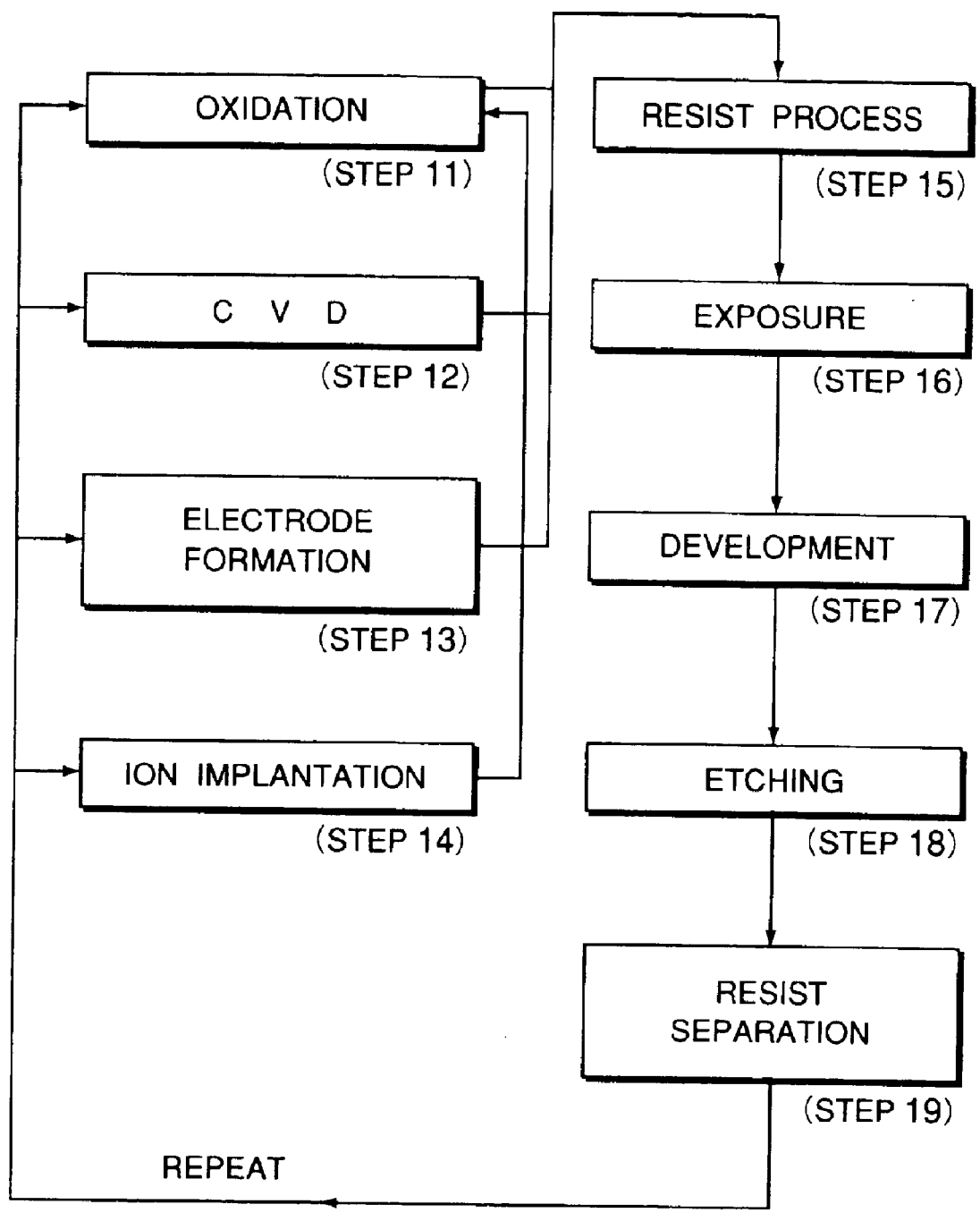
FIG. 18 is a flow chart for explaining details of the wafer process included in the flow chart of FIG. 17.

FIG. 18 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

Since the machines used in these processes are maintained through a remote maintenance system as described above, any disorder may be prevented beforehand. If it occurs, it can be met quickly. Therefore, the device productivity can be improved significantly.

While the invention has been described with reference to the structures disclosed herein, it is not confined to the details set forth and this application is intended to cover such modifications or changes as may come within the purposes of the improvements or the scope of the following claims.

What is claimed is:

1. A moving stage device, comprising:
   a movable stage;
   a magnetic driving system for controlling a position of the stage; and
   a repulsive force generator for accelerating and/or decelerating the stage with respect to a movement direction, said repulsive force generator having (i) a set magnet including a plurality of magnets disposed along a direction orthogonal or substantially orthogonal to the movement direction, with a spacing therebetween while different poles of them are opposed to each other, and (ii) an insert magnet to be mountably and demountably inserted into the spacing and being disposed with respect to the set magnet so that the same poles are opposed to each other.

2. A movable stage device according to claim 1, wherein one of the set magnet and the insert magnet is provided at each of opposite ends of the stage, while the other of the set magnet and the insert magnet is provided at each of opposite ends of a stroke of the stage.

3. A movable stage device according to claim 2, wherein the set magnet sandwiches the insert magnet with respect to a direction orthogonal or substantially orthogonal to the first direction.

4. A movable stage device according to claim 1, wherein said magnetic driving system is operable to perform positional control with respect to X, Y and θ directions, where Y is the movement direction, X is a direction orthogonal to the movement direction, and θ is a rotational direction about an axis perpendicular to an X-Y plane.

5. A movable stage device according to claim 4, wherein said magnetic driving system includes a single-phase linear motor, and wherein said linear motor includes a movable element being movable integrally with the stage.

6. A movable stage device according to claim 1, wherein the set magnet and the insert magnet have a plate-like member being magnetized in its thickness direction.

7. An exposure apparatus, comprising:
   a movable stage;
   a magnetic driving system for controlling a position of the stage; and
   a repulsive force generator for accelerating and/or decelerating the stage with respect to a movement direction, said repulsive force generator having (i) a set magnet including a plurality of magnets disposed along a direction orthogonal or substantially orthogonal to the movement direction, with a spacing therebetween while different poles of them are opposed to each other, and (ii) an insert magnet to be mountably and demountably inserted into the spacing and being disposed with respect to the set magnet so that the same poles are opposed to each other,
   wherein the amount of insertion of the insert magnet into the spacing is changeable in accordance with dose in exposure with respect to a substrate to be placed on the stage.

8. An exposure apparatus, comprising:
   a movable stage;
   a magnetic driving system for controlling a position of the stage; and
   a repulsive force generator for accelerating and/or decelerating the stage with respect to a movement direction, said repulsive force generator having (i) a set magnet including a plurality of magnets disposed along a direction orthogonal or substantially orthogonal to the movement direction, with a spacing therebetween while different poles of them are opposed to each other, and (ii) an insert magnet to be mountably and demountably inserted into the spacing and being disposed with respect to the set magnet so that the same poles are opposed to each other, wherein a relative position of the set magnet and the insert magnet is changeable in accordance with an exposure region of a substrate to be placed on the stage.

9. An exposure apparatus, comprising:

a movable stage for holding thereon a substrate to be exposed;

a magnetic driving system for controlling a position of the stage; and a repulsive force generator for accelerating and/or decelerating the stage with respect to a movement direction, said repulsive force generator having (i) a set magnet including a plurality of magnets disposed along a direction orthogonal or substantially orthogonal to the movement direction, with a spacing therebetween while different poles of them are opposed to each other, and (ii) an insert magnet to be mountably and demountably inserted into the spacing and being disposed with respect to the set magnet so that the same poles are opposed to each other.

10. A method of moving a moving stage, comprising the steps of:

accelerating the stage with respect to a movement direction by use of a repulsive force generator, the repulsive force generator having (i) a set magnet including a plurality of magnets disposed along a direction orthogonal or substantially orthogonal to the movement direction, with a spacing therebetween while different poles of them are opposed to each other, and (ii) an insert magnet to be mountably and demountably inserted into the spacing and being disposed with respect to the set magnet so that the same poles are opposed to each other; and controlling the position of the stage after the acceleration, by use of a driving system.

11. A device manufacturing method, comprising the steps of:

providing a group of production machines for various processes, including an exposure apparatus as recited in claim 9, in a semiconductor manufacturing factory; and producing a semiconductor device through plural processes using the production machine group.

12. A method according to claim 11, further comprising (i) connecting the production machines of the group with each other through a local area network, and (ii) executing data-communication concerning information related to at least one production machine of the production machine group, between the local area network and an external network outside the semiconductor manufacturing factory.

13. A method according to claim 12, wherein a database provided by a vendor or a user of the exposure apparatus can be accessed through the external network so that maintenance information related to the production machine can be obtained through the data communication, and wherein production control can be performed on the basis of data communication made through the external network and between the semiconductor factory and a separate semiconductor factory.

14. A semiconductor manufacturing factory, comprising:

a group of production machines for various processes, including an exposure apparatus as recited in claim 9;

a local area network for connecting the production machines of the production machine group with each other; and a gateway for enabling an access from the local area network to an external network outside the factory;

wherein information related to at least one production machine in the group can be data communicated by use of the local area network and the gateway.

15. A method of executing maintenance for an exposure apparatus, provided in a semiconductor manufacturing factory, said method comprising the steps of:

preparing, by a vendor or a user of an exposure apparatus as recited in claim 9, a maintenance database connected to an external network outside the semiconductor manufacturing factory;

admitting an access from the semiconductor manufacturing factory to the maintenance database through the external network; and transmitting maintenance information stored in the maintenance database to the semiconductor manufacturing factory through the external network.

16. An apparatus according to claim 9, further comprising a display, a network interface and a computer for executing network software, wherein maintenance information related to said exposure apparatus is data communicated through the computer network.

17. An apparatus according to claim 16, wherein the network software provides on the display a user interface for accessing a maintenance database prepared by a vendor or a user of said exposure apparatus and connected to an external network outside a factory where said exposure apparatus is placed, thereby to enable obtaining information from the database through the external network.

* * * * *

UNITED STATES PATENT AND TRADEMARK OFFICE
CERTIFICATE OF CORRECTION

PATENT NO. : 6,903,468 B2
DATED : June 7, 2005
INVENTOR(S) : Nobushige Korenaga

It is certified that error appears in the above-identified patent and that said Letters Patent is hereby corrected as shown below:

Column 2,
Lines 55 and 62, "can not" should read -- cannot --.

Column 3,
Line 5, "simple" should read -- simply --.
Lines 10 and 21, "can not" should read -- cannot --.

Column 4,
Line 15, "dose" should read -- the dose --.

Column 7,
Line 34, "can not" should read -- cannot --.

Column 8,
Line 49, "to" should be deleted.

Column 13,
Line 46, "is" should read -- it --.

Column 18,
Line 52, "dose" should read -- a dose --.

Signed and Sealed this

Twenty-fifth Day of October, 2005

JON W. DUDAS
*Director of the United States Patent and Trademark Office*